(12) United States Patent
Mostafanezhad et al.

(10) Patent No.: US 11,782,164 B2
(45) Date of Patent: Oct. 10, 2023

(54) SYSTEM AND METHOD FOR HIGH DYNAMIC RANGE WAVEFORM DIGITIZATION

(71) Applicant: Nalu Scientific, LLC, Honolulu, HI (US)

(72) Inventors: Isar Mostafanezhad, Honolulu, HI (US); Luca Macchiarulo, Honolulu, HI (US); Dean Uehara, Honolulu, HI (US); Christopher Chock, Honolulu, HI (US); Benjamin Rotter, Honolulu, HI (US); Ruth Perron, Honolulu, HI (US); Gregory Uehara, Kailua, HI (US)

(73) Assignee: Nalu Scientific, LLC, Honolulu, HI (US)

( * ) Notice: Subject to any disclaimer, the term of this patent is extended or adjusted under 35 U.S.C. 154(b) by 0 days.

(21) Appl. No.: 17/515,745

(22) Filed: Nov. 1, 2021

(65) Prior Publication Data

US 2022/0057522 A1    Feb. 24, 2022

Related U.S. Application Data

(63) Continuation of application No. 17/273,851, filed as application No. PCT/US2019/050690 on Sep. 11, 2019.

(60) Provisional application No. 63/108,131, filed on Oct. 30, 2020, provisional application No. 62/758,711, filed on Nov. 12, 2018, provisional application No. 62/758,714, filed on Nov. 12, 2018, provisional application No. 62/731,517, filed on Sep. 14, 2018, provisional application No. 62/729,823, filed on Sep. 11, 2018.

(51) Int. Cl.
| | | |
|---|---|---|
| *H03M 1/12* | (2006.01) |
| *G01S 17/931* | (2020.01) |
| *B60W 30/08* | (2012.01) |
| *H03M 1/18* | (2006.01) |

(52) U.S. Cl.
CPC ........... *G01S 17/931* (2020.01); *B60W 30/08* (2013.01); *H03M 1/1245* (2013.01); *B60W 2420/42* (2013.01); *B60W 2420/52* (2013.01); *H03M 1/188* (2013.01)

(58) Field of Classification Search
CPC .... H03M 1/1245; H03M 1/188; B60W 30/08; B60W 2420/42; G01S 17/931
USPC .................................................. 341/155, 159
See application file for complete search history.

(56) References Cited

U.S. PATENT DOCUMENTS

| | | | | |
|---|---|---|---|---|
| 2014/0118010 A1* | 5/2014 | Fan | .................... | G01R 27/2605 324/658 |
| 2015/0349818 A1* | 12/2015 | Hu | .......................... | G01R 31/14 375/296 |

* cited by examiner

*Primary Examiner* — Peguy Jean Pierre
(74) *Attorney, Agent, or Firm* — Staniford Tomita LLP

(57) ABSTRACT

Diverse applications from particle physics experiments to lidar are driving cost and current reduction in giga-hertz sampling rate high-resolution data conversion. Multiple imagers captures a single pixel of data and require processing at very high speed. High-bandwidth high-rate signal sampling, analog-to-digital conversion, and transfer of large amounts of data to a digital data acquisition block are required in such systems. Dynamic range, power consumption, and transfer of high-speed, high-bit width data are key implementation challenges. Data acquisition architectures optimized for specific requirements of such systems may facilitate system implementation and reduce overall system cost.

20 Claims, 25 Drawing Sheets

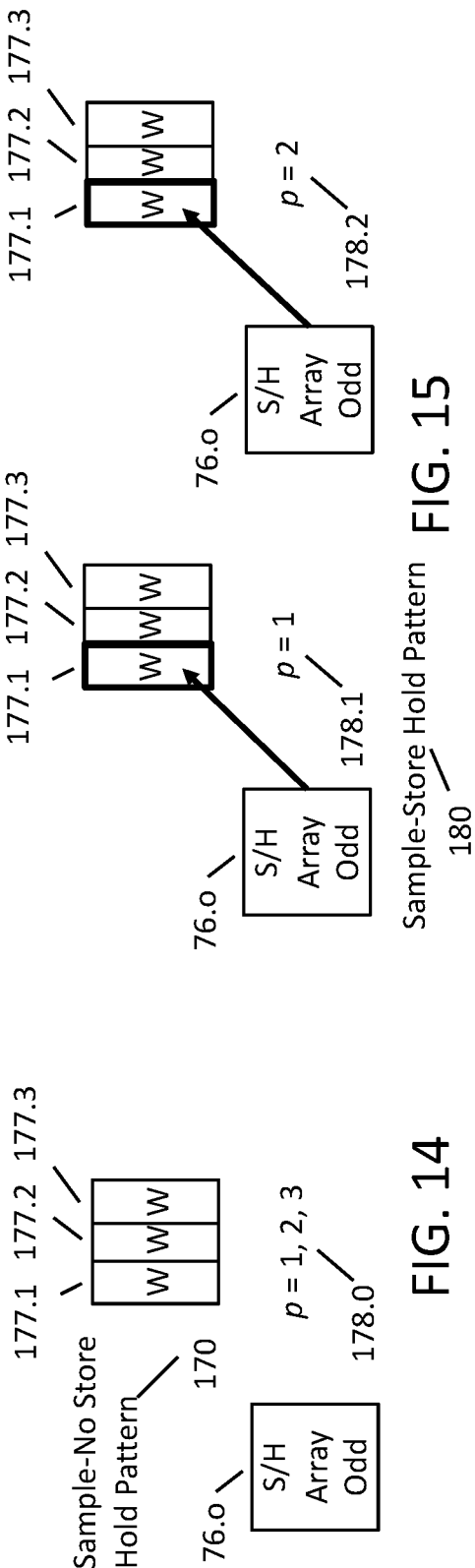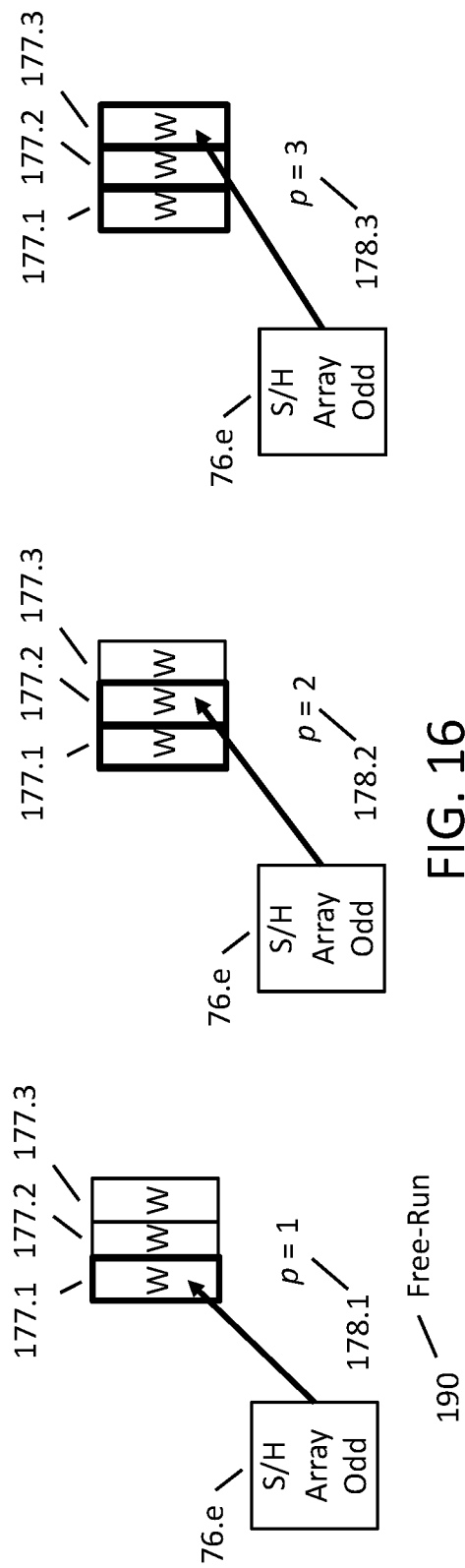

SYSTEM AND METHOD FOR HIGH DYNAMIC RANGE WAVEFORM DIGITIZATION

CROSS-REFERENCE TO RELATED APPLICATIONS

This application claims priority to U.S. Provisional Patent Application No. 63/108,131, "System and Method for High Speed Analog Signal Acquisition, Region of Interest Activity Detection with Low Dead Time Operation and Efficient Transmission and Control" filed 30 Oct. 2020. This application is also a continuation in part of U.S. patent application Ser. No. 17/273,851, "System And Method For High-Sample Rate Transient Data Acquisition With Pre-Conversion Activity Detection" filed on 5 Mar. 2021 which is a US National Phase Application under 35 USC 371 of PCT Application No. PCT/US19/50690, "System And Method For High-Sample Rate Transient Data Acquisition With Pre-Conversion Activity Detection" filed on 11 Sep. 2019 which claims priority to U.S. Provisional Patent Application No. 62/758,714, "Data Acquisition SoC for Waveform Sampling and Feature Extraction with Picosecond Timing" filed on 12 Nov. 2018, U.S. Provisional Patent Application No. 62/758,711, "Data Acquisition SoC for Waveform Sampling and Feature Extraction with Picosecond Timing" filed on 12 Nov. 2018, U.S. Provisional Patent Application No. 62/731,517, "Design and Calibration of System0onChip Switched Capacitor Array Based Waveform Digitizers For Particle Tracking" filed on Sep. 14, 2018, and U.S. Provisional Patent Application No. 62/729,823, "System On-Chip For Fast Timing Measurements" filed on 11 Sep. 2018. U.S. Pat. No. 10,715,166, PCT Application No. PCT/US19/50690, U.S. patent application Ser. No. 17/273,851, and Provisional Patent Application Nos.: 63/108,131, 62/758,714, 62/758,711, 62/731,517, and 62/729,823 are hereby incorporated by reference in their entirety.

GOVERNMENT LICENSE RIGHTS

This patent was prepared as an account of work sponsored by an agency of the United States Government. Neither the United States Government nor any agency thereof, nor any of their employees, makes any warranty, express or implied, or assumes any legal liability or responsibility for the accuracy completeness, or usefulness of any information, apparatus, product, or process disclosed, or represents that its use would not infringe privately owned rights. Reference herein to any specific commercial product, process, or service by trade name, trademark, manufacturer, or otherwise does not necessarily constitute or imply its endorsement, recommendation, or favoring by the United States Government or any agency thereof. The views and opinions of authors expressed herein do not necessarily state or reflect those of the United States Government or an agency thereof.

This material is based upon work supported by the U.S. Department of Energy, Office of Science, under Award Numbers DE-SC0017833 and DE-SC0019527.

FIELD OF THE INVENTION

Embodiments disclosed relate to systems and methods for gigahertz sampling analog-to-digital converters for applications in particle physics experiments and technologies such as lidar where critical aspects of the received signal occur only during relatively short nanosecond portions of observation periods lasting microseconds. Optimizing the architecture of the data acquisition circuitry to key on portions of the data with signal activity may result in significant reduction in overall system implementation complexity, power management requirements, and may reduce overall system cost.

BACKGROUND

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches, which in and of themselves may also be embodiments of the invention.

Scientists may gain insights into fundamental principles and understanding of materials through particle accelerator experiments. In these experiments, the velocity of a first group of particles may be increased in a magnetic field and made to collide with an object or second group of particles accelerated and directed to collide with the first group. Sensors may be used to observe collision artifacts resulting from the collisions. Collision artifacts may typically be present for very short periods of time. The duration of collision artifacts may define an observation period of interest. In some applications, collision artifacts may be available for a few nanoseconds. In some experiments, one or a small set of sensors may be used to detect collision artifacts. In other experiments, a large number of sensors may be used to simultaneously observe collision artifacts. The number of sensors that may be used in experiments may number in the tens, hundreds, or even thousands. In many applications, accurate timing measurements of collisions and collision artifacts are critical measured parameters. In some applications, the desired relative timing accuracy, that is the desired relative timing between collisions and collision artifacts may be under 100 picoseconds. In some applications, the desired relative timing accuracy may be under 20 picoseconds. In some applications, the desired relative timing accuracy may be under one picosecond. In future applications, the desired relative timing accuracy may be on the order of femtoseconds. In future applications, the desired relative timing accuracy may be less than one femtosecond. In order to accurately capture the signals received from the sensors, very high sampling rates are used in the data acquisition electronics. In some applications, the sampling rate may be hundreds of megahertz. In some applications, the sampling rate may be gigahertz. For example, in an application, the sampling rate may be one-gigahertz. In another application, the sampling rate may be ten-gigahertz. In another application, the sampling rate may exceed ten-gigahertz.

There may be other applications where the arrival time of signals may be detected by sensors and accurately translated into the digital domain by data acquisition electronics. An example of such as system is lidar. Lidar is an acronym which stands for Light Detection and Ranging. In a lidar system, a lidar device may include a light source, a light detector, and measurement electronics. In an application, the light source may be a laser. One or more pulses of light may be emitted by the laser. Light emitted from the laser may be directed in a specific direction. When the pulse of emitted laser light hits a remote object, it may reflect off the object and a portion of the emitted laser light may return to the lidar device as reflected laser light. The reflected laser light may be received by the light detector and processed by measurement electronics. The roundtrip time duration from the instant the light is transmitted from the light source as transmitted light, to the instant the reflected light is received by the light detector may be measured by the measurement electronics. Based on the roundtrip time duration, the system may calculate the distance from the lidar device to the remote object. The maximum roundtrip time duration may be limited by the distance limit between the lidar device and the remote device. If the distance between the lidar device and a remote object exceeds a distance limit, the object may not be identified. A distance limit may occur due to the path attenuation of the emitted laser light returning with an amplitude that is too small to be detected due to the dynamic range of the measurement electronics. For some applications, the maximum roundtrip time duration may be on the order of microseconds. In an application, the maximum roundtrip time duration may be six microseconds. In an application, the maximum roundtrip time duration may be less than six microseconds. In another application, the maximum roundtrip time duration may be greater than six microseconds. In the application of lidar, the relative timing accuracy may translate into a distance measurement accuracy between the lidar device and the remote object. A relative timing accuracy of 1 nanosecond may translate to a distance measurement accuracy of approximately 0.3 meters.

Some implementations of lidar utilize time-to-digital converters which may have a simple implementation utilizing a comparator and a counter. Other implementations may utilize an analog-to-digital converter and matched filtering which may be less sensitive to noise and more robust to the well-known problem of range walk error. However, due to the large amount of data that needs to be handled using analog-to-digital conversion, system designers often choose systems utilizing time-to-digital converters for simplicity. If the use of analog-to-digital converter-based designs can be made convenient, their use may become more prevalent due to the potential advantages in system robustness and accuracy.

To summarize, there are existing and the potential for emerging applications where data acquisition electronics with sample rates in the hundreds of megahertz to the gigahertz range, time events with a signal duration of interest as low as a few nanoseconds, and timing accuracy in the range of tens of picoseconds or less may be desired. Analog-to-digital converter resolution requirements may be between the range of six-bits to ten bits. In some applications, analog-to-digital converter resolutions fewer than six bits may be used. In other applications, analog-to-digital converter resolutions greater than ten bits may be used. The data acquisition system may provide: a. Digitized data—active portions of the signal may be converted into digital representation with moderate resolution and high sample rate; and b. Timing data—data to enable the identification of the position of a signal occurrence in time relative to a timing reference.

Architecting the data acquisition architecture to key in on portions of the received signal that may contain signal activity or data of interest and ignore data that may not contain data of interest may result in significant reduction in implementation complexity, peak current, power management, and power distribution requirements. Systems implementing such architectures may facilitate ease of use and reduce overall system cost.

SUMMARY OF THE INVENTION

A data acquisition system may periodically sample a continuous input signal and convert the samples to the digital domain using an analog-to-digital converter. In systems requiring sampling frequencies in the gigahertz range, and analog-to-digital converter resolutions with 8 or more bits, a large amount of digital data may be generated in a short period of time. Analog-to-digital converters with sampling frequency in the gigahertz range and high-speed storage pose implementation challenges. Such challenges may be exacerbated in systems such as particle physics experiments and lidar where a multiplicity of sensors and data acquisition systems may be used in parallel. In these systems, the input signal is predominantly zero-valued or unchanging in value most of the time, and non-zero or changing in value for only relatively short periods of time. To implement these systems, the challenges of high-rate analog-to-digital conversion and storage must first be met. Then, digital data must be combed through to identify non-zero data and the time location of said non-zero data relative to a time reference.

In general, the time-domain waveform including the signal shape, amplitude, and position in time may be important. In particle physics experiments and lidar, the received signal may have two or more non-zero excursions. In some applications, there may be multiple non-zero excursions that occur over a period of time. In the application of lidar, path loss may be significant if the object that the light source is reflected off is far from the light source. The result may be demanding dynamic range requirements on the data acquisition circuitry. In an application, sensors may be paired with data acquisition units and placed a few meters apart. In such systems, transferring data from the remote units to a centralized digital data acquisition block which consolidates data from each of the remote devices may pose a challenge.

In particle experiments and lidar, the received signal may be detected by a receive sensor that may output a current. The sensor output current may be input to a silicon photomultiplier or other current amplifying device that may provide current gain, and the output of this device may be input to a transimpedance amplifier or TIA. The output of the TIA may be a voltage that may be proportional to the received signal detected by the receive sensor and input to data acquisition circuitry. The current amplifying device and TIA may be implemented using external components. In an embodiment, the TIA may be implemented with each channel on the same substrate in an integrated circuit. In another embodiment, an image sensor and a TIA may be implemented with each channel on the same substrate in an integrated circuit.

In the present invention, the front-end of the data acquisition circuitry may include an array of sample-and-hold circuits or sampling array may acquire samples at a high rate and transfer the samples in parallel to analog storage cells. In an embodiment, two arrays with each sample-and-hold array comprised of a multiplicity of sampling circuits may operate in a time-interleaved manner operating in either sample mode or store mode wherein sample mode may involve acquiring contiguous samples of the input by sampling circuits and wherein store mode may involve transferring acquired samples into storage cells. The two modes may be referred to as sample-and-store.

The samples may be acquired and stored into analog storage cells in groups. The number of samples acquired by a particular sample-and-hold array during a sample mode and stored during a store mode may be referenced as a window. A window may refer to a number of samples (window of samples), a number of sampling circuits (window of sampling circuits), a number of storage cells (window of storage cells), a number of ADCs (window of ADCs), or a number of elements (window of elements) wherein elements may include sampling circuits or storage circuits. A window of storage cells may comprise a storage window. The terms analog storage cells and storage cells may be used interchangeably.

In an embodiment, a window of samples may be 64. During a sample-and-store cycle, a window of contiguous samples may be acquired in a window of sampling cells that may be transferred into one of a multiplicity of storage windows. In another embodiment, a window may be fewer than 64. In another embodiment, a window may be greater than 64. In an embodiment, a storage window may connect through switches to an analog-to-digital converter (ADC). In an embodiment, the ADC may be implemented with a window of ADCs configured as parallel ADCs. In an embodiment, the ADC may be implemented with a multiplicity of time-interleaved ADCs fewer than a window of elements. In an embodiment, two time-interleaved arrays of sampling circuits, a multiplicity of storage windows, an ADC, an Activity Detector, and a Time Tracker may comprise a channel. The Activity Detector may identify activity in the input signal and exert an Activity Detected signal when the input signal exceeds an Activity Threshold. The Time Tracker may receive inputs including the TRIGGER or the output of the Activity Detector, one of these inputs may provide a time reference for the Time Tracker, and the Time Tracker may control the multiplexors and keep track of window-time data, wherein window-time data may include which analog storage arrays are receiving samples and when, relative to the time reference, the samples were acquired. In an embodiment, the number of storage windows may be 64. In another embodiment, the number of storage windows may be fewer than 64. In another embodiment, the number of storage windows may be greater than 64. The sampling arrays may connect to the analog storage cells through analog multiplexors which may be implemented using arrays of transmission gates. The product of the time period to acquire a window of samples and the number of storage windows may comprise an Observation Period. The Observation Period may describe the time duration represented by contiguously acquired samples stored in the storage windows. For example, if the sample rate is 10 GHz, the window of samples is 64, and there are 64 storage windows, the Observation Period may be the product of the sampling period which is 100 psec per sample, 64 samples per window, and 64 storage windows may result in an Observation Period of 409.6 nsec. In an embodiment, one channel may connect to one external input driven by one sensor or signal source.

In an embodiment, a multiplicity of said channels may be integrated into a singular waveform digitizer with each of the said channels connecting to a unique input signal source; the outputs of said channels may couple to a digital signal processor which may provide digital signal processing on the digital outputs from said channels, may temporarily store channel samples, and may provide coding including coding for error detection and correction; an externally provided TRIGGER input may identify when to begin or end a data acquisition period of sampling and digitizing samples of the input; the digital outputs from said channels may include digitized data corresponding to samples of the input signals and window-time data enabling the identification of when samples were acquired relative to a time reference; a time reference may be established by an externally provided TRIGGER input; an input reference CLKIN where the frequency of CLKIN may be lower than the input sampling rate of the channels, a phase-lock loop or delay-lock loop and clock generation circuitry that may receive input CLKIN and generate sampling clocks and sample transfer clocks; a digital output driver, for example an LVDS driver, that may provide a digital interface to transmit the digital data to the external digital data acquisition block of the system which consolidates data received from the multiplicity of waveform digitizers in the system; and a provision to provide a READY signal which may inform the external digital data acquisition block that analog-to-digital conversion of samples temporarily stored in analog storage is complete and ready for transmission. In an embodiment, a STOP-START input control bit may define if TRIGGER may stop or start a data acquisition period.

In an embodiment, during the time the samples stored in analog storage are being converted to the digital domain by the ADC, the analog storage cells may be unavailable for receiving fresh samples. As a result, storage may be disabled during analog-to-digital conversion. This may define a dead time wherein the acquisition of new samples may not be possible. In an embodiment that may be referenced as banking, the available storage windows may be partitioned into an integer number of window sub-groups. In an embodiment of banking, half of the storage windows may be allocated to the first time-interleaved sampling array, and these storage windows may be split into two window subgroups. The TRIGGER or Activity Detector may initiate a repeating sample-and-store sequence that continues until the first window sub-group is full of fresh samples. Then, these samples may be converted to the digital domain by the ADC. During this time, TRIGGER or the Activity Detector may initiate a new repeating sample-and-store sequence utilizing the second window sub-group that continues until the second window sub-group is full of fresh samples. When the analog-to-digital conversion of the first window sub-group of samples is complete, then the second window sub-group may be connected to the ADC for digitization. In an embodiment of a waveform digitizer utilizing banking, the available sampling arrays may be split into more than two subgroups.

When a channel is powered up but not in an active repeating sample-and-store sequence, samples may not be acquired during the sample mode or acquired samples may not be transferred to the analog storage during the store mode. In an embodiment, a sample-store hold pattern may be implemented wherein each of two time-interleaved sampling arrays may acquire a window of samples with a respective sampling array, and repeatedly transfer the respective window of samples into a respective storage window. In said embodiment, an Activity Detector may receive the same input as the channel. If the Activity Detector detects signal activity during a sample mode, the Time Tracker may switch the channel out of the sample-store hold pattern into a sample-and-store pattern wherein multiple windows of channel samples may be acquired and stored. The sample-store hold pattern may relax latency requirements on the Activity Detector between when the input may exceed the activity threshold and when an activity detected signal may be asserted. Without the sample-store hold pattern, if the input exceeds the activity threshold toward the end of a sample mode but activity detected signal is not asserted in time before the sample mode is complete, storage may not occur and samples may be lost. The sample-store hold mode may insure no samples are lost.

In an embodiment, a sample-store hover mode may be implemented wherein each of two time-interleaved sampling arrays may acquire a first window of samples with a respective sampling array, and transfers the first respective window of samples into a first respective storage window, then acquire a second window of samples, and transfer the second respective window of samples into a second respective storage window. If the Activity Detector detects signal activity during a sample mode, the Time Tracker may switch the channel out of the sample-store hover pattern into a sample-and-store pattern wherein multiple windows of channel samples may be acquired and stored. In an embodiment, continuity may be maintained wherein if activity is detected during sampling or transfer of the first storage window, the next window of samples may be transferred to the second storage window and so forth, or if activity is detected during sampling or transfer of the second storage window, the next window of samples may be transferred to the third storage window and so forth. Sample-store hover mode may utilize two or more storage windows for the sample-and-store sequence.

In an embodiment, a Free-Run mode may be implemented wherein irrespective of a TRIGGER or detected activity by the Activity Detector, the each of the time-interleaved sample arrays repeatedly acquires a window of samples, and transfers the acquired samples into a respective one-half of the available storage windows one window at a time beginning with a first storage window pair, then a second storage window par, on through a last storage window pair. When samples have been transferred to the last storage window pair, during the next transfer period, samples may be transferred into the first storage window pair, then, the second storage window pair and so forth. In an embodiment, Free-Run may be used when the STOP-START bit is set to logic 0.

In an embodiment, a waveform digitizer may be integrated into a Lidar Integrated System wherein an external clock source CLKIN may be input to the system and CLKIN may be used as a time reference to initiate a transmit pulse for a light source which may be a laser, and CLKIN may be used to latch the TRIGGER signal which may be used by the waveform digitizer to establish a time reference for waveform digitization. A lidar controller may use the common time reference for the transmit pulse and receive waveform digitization to calculate roundtrip delay. In an embodiment, a laser driver may be integrated into a Lidar Integrated System. In an embodiment, a TIA for an image sensor may be integrated into a Lidar Integrated System. In an embodiment, an image sensor and TIA may be integrated into a Lidar Integrated System.

In an embodiment hereby referenced as the high-dynamic range waveform digitizer, the input may connect to a first amplifier with gain A1, the output of the first amplifier may couple to a first channel and a second amplifier with gain A2, the output of the second amplifier may couple to a second channel and a third amplifier with gain A3, the output of the third amplifier may couple to a third channel and a fourth amplifier with gain A4, and the output of the fourth amplifier may couple to a fourth channel. In an embodiment, the gain of the first amplifier A1 may be unity. In another embodiment, the gain of the first amplifier A1 may be less than unity. In another embodiment, the gain of the first amplifier A1 may be greater than unity. In another embodiment, the gain of the first amplifier A1 may be programmable. In an embodiment, the gain of the second amplifier A2, third amplifier A3, and fourth amplifier A4 may be substantially similar and greater than unity. In an embodiment, the gain of the second amplifier A2, third amplifier A3, and fourth amplifier A4 may be substantially similar and equal to five. In an embodiment, the gain of the second amplifier A2, third amplifier A3, and fourth amplifier A4 may be different but greater than unity. In an embodiment, the gain of the second amplifier A2, third amplifier A3, and fourth amplifier A4 may each be programmable. In an embodiment, the number of amplifiers and channels may be fewer than four. In another embodiment, the number of amplifiers and channels may be larger than four. In an embodiment, the first amplifier A1 may be excluded.

In an embodiment of the high-dynamic range waveform digitizer, the outputs of each of the channels may be passed to a digital signal processing block for digital signal processing (DSP) algorithms to be applied. In an embodiment, the digital signal processing algorithms may process samples covering an Observation Period of time. In an embodiment, the DSP algorithms may be utilized to identify the channel with the largest amplitude without clipping. In an embodiment, a Peak Threshold value may be input to the DSP algorithms, data from each channel may be compared with the Peak Threshold, and the channel data that is largest without exceeding the Peak Threshold may be selected and output for further processing by the system.

In an embodiment of the high-dynamic range waveform digitizer, a signal source may be used to provide a calibration signal near the input of the first channel to enable via digital signal processing, the measurement of gain of each amplifier following the insertion of the calibration signal and the group delay through each amplifier following the insertion of the calibration signal. In an embodiment, DSP may be utilized to compensate for gain variations and equalize for group delay variations in the amplifiers due to process, temperature, and voltage variations. In an embodiment, the group delay variations may be characterized and compensated for as time delay variations. In an embodiment, digital signal processing may be used to minimize the signal processing impact of the amplifiers including amplitude and phase response on the time-domain accuracy at the output of each channel. In an embodiment, the calibration signal may be a voltage step. In an embodiment, the calibration signal may have a sawtooth shape. In an embodiment, the calibration signal may have a distinguishable characteristic or distinguishable characteristics suitable for measuring and identifying gain and for measuring and identifying the group delay from the calibration source to the input of each channel. In an embodiment, the calibration signal may be applied at the input of the first channel. In another embodiment, the calibration signal may be applied at the input of the first amplifier A1. In another embodiment, the calibration signal may be applied by an external circuit onto the input of the waveform digitizer.

In an embodiment, the high-dynamic range waveform digitizer may utilize the TRIGGER signal to initiate and synchronize sample-and-store within each of the channels. In an embodiment of the high-dynamic range waveform digitizer, banking may be utilized wherein Activity Detectors may be utilized to initiate and synchronize a period of sample-and-store to fill a window subgroup within each channel. In said embodiment, each Activity Detector may communicate status to the other Activity Detectors to initiate and synchronize sample-and-store based on the first activity detected signal activation.

In an embodiment, the Activity Detected output of the Activity Detector may be used with the TRIGGER input in an application of the TRIGGER input. In an embodiment, the Activity Detected output of the Activity Detector may be used in place of the TRIGGER input in an application of the TRIGGER input. In an embodiment, the Activity Detected output of the Activity Detector may be used to end or stop a sample-and-store sequence.

In an embodiment a TRIGGER signal and a STOP-START signal may be input to a Control block of the system. Both TRIGGER and STOP-START may be latched on a clock edge of system input clock CLKIN. In an embodiment, when STOP-START is logic 0 (stop mode), TRIGGER may be used to stop the acquisition of samples, thus ending an acquisition period; and when STOP-START is logic 1 (start mode), TRIGGER may be used to start the acquisition samples and thus begin an acquisition period. In an embodiment, a system may be implemented to support STOP-START logic 0 or STOP-START logic 1.

In an embodiment, a sensor node comprised of a sensor array and a waveform digitizer with added support for a token passing ring protocol may be placed in a ring topology with a multiplicity of similar sensor nodes. A digital data acquisition block may initiate communication by passing a token to a first sensor node, the first sensor node may pass the token to a second sensor node and so forth, until the token returns to the digital data acquisition block, and the digital data acquisition block may again pass the token to the first sensor node. When a waveform digitizer acquires samples and digitizes the samples, when the token arrives at said waveform digitizer, the waveform digitizer may transmit the digitized samples and timing data into the ring, and this data may be passed through the ring until it is received by the digital data acquisition block. When said waveform digitizer has completed sending the digitized samples and timing data, said waveform digitizer may release the token by passing the token to the next sensor node, and the token may be passed from sensor node to sensor node until it returns to the digital data acquisition block.

In an embodiment, a pipeline ADC stage may be inserted between the S/H Array and the Storage Array and the output bits from said pipeline ADC stage may be concatenated to the output bits of the ADC following the Storage Array as the MSBs, and may increase the dynamic range of the composite analog-to-digital converter.

BRIEF DESCRIPTION OF THE DRAWINGS

Other objects and features of the present invention will become apparent from the following detailed description considered in connection with the accompanying drawings which disclose several embodiments of the present invention. It should be understood, however, that the drawings are designed for the purpose of illustration only and not as a definition of the limits of the invention.

FIG. 14 illustrates an alternative to handling the condition when sample-and-store is not occurring wherein samples are not transferred to analog storage.

FIG. 15 illustrates the Sample-Store Hold Pattern wherein samples are repeatedly transferred to the same cells in analog storage.

FIG. 16 illustrates Free-Run wherein samples are repeatedly transferred to a new window of storage cells each transfer period.

DETAILED DESCRIPTION

Figure 1:
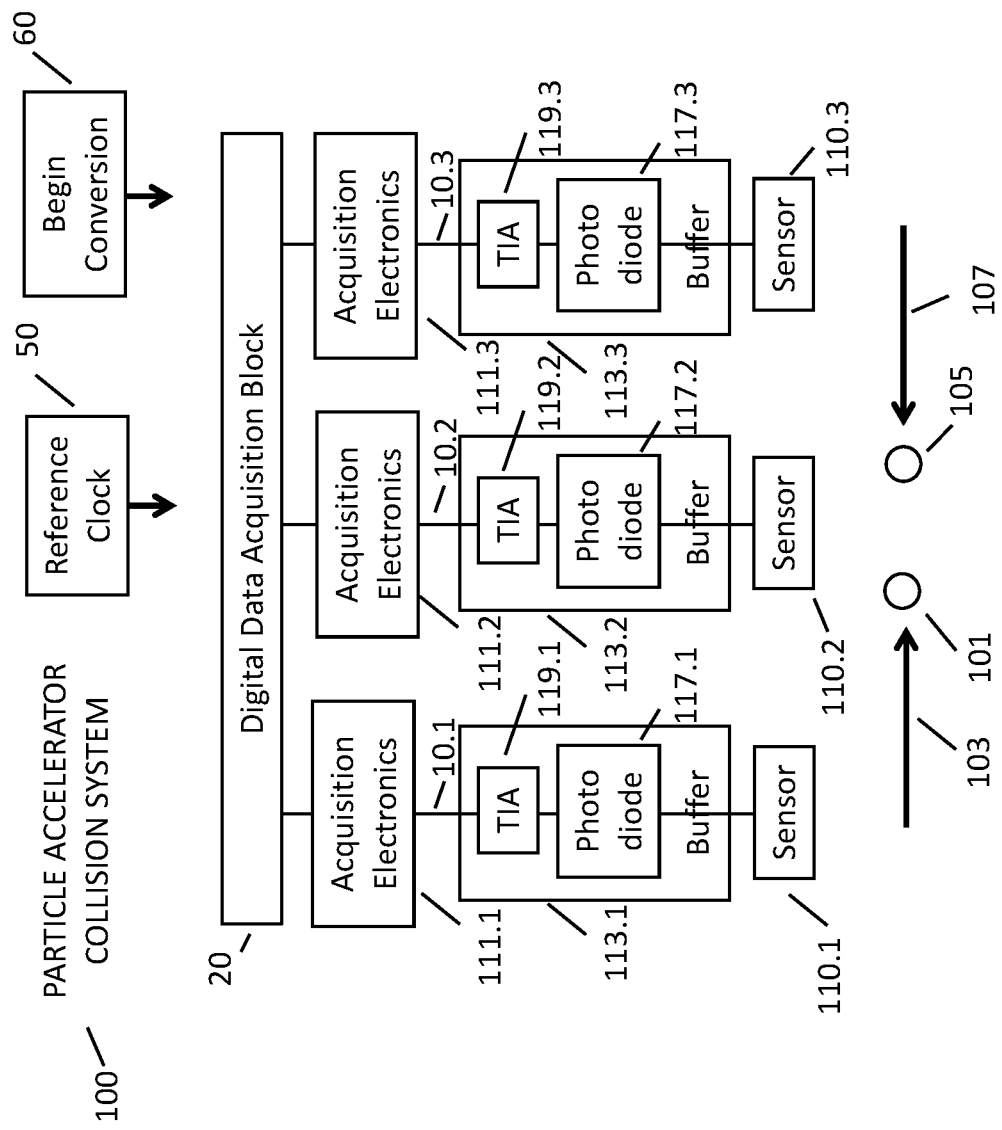
FIG. 1 illustrates a simplified block diagram of a Particle Accelerator System.

With reference to FIG. 1, functional blocks associated with the data acquisition portion of a particle accelerator system 100 are shown. Particles may be repeatedly propelled by an electric field through a circular pipe which may increase particle velocity. When a particle or particles reach the desired energy level, a target may be placed into their path where a particle collision detector may observe the collision. A particle collision detector may be comprised of a sensor 110.1, sensor interface buffer 113.1, and acquisition electronics 111.1. Sensor 110.1 may be an image sensor that may output a current that may be input to a sensor interface buffer 113.1. The buffer 113.1 may include a silicon photomultiplier, photomultiplier, or other current amplifying device 117.1 that may provide current gain, and the output of this device may be input to a transimpedance amplifier or TIA 119.1. The output of the TIA 119.1 may be a voltage that may be proportional to the received signal detected by sensor 110.1 and input to data acquisition circuitry 111.1.

In some applications, a multiplicity of sensors may be utilized in the system 100. In an application, a first particle 101 with a first velocity 103 may collide with a target. In an application, the target may be a second particle 105 with a second velocity 107. A first particle collision detector comprised of sensor 110.1, sensor interface buffer 113.1, and acquisition electronics 111.1, a second particle collision detector comprised of sensor 110.2, sensor interface buffer 113.2, and acquisition electronics 111.2, and a third particle collision detector comprised of sensor 110.3, sensor interface buffer 113.3, and acquisition electronics 111.3 may be used to observe and record particles and radiation that may be produced by the collision. In an application, one particle collision detector may be utilized. In another application, a multiplicity of particle collision detectors may be used. In an application, over one thousand particle collision detectors may be used.

Figure 2:
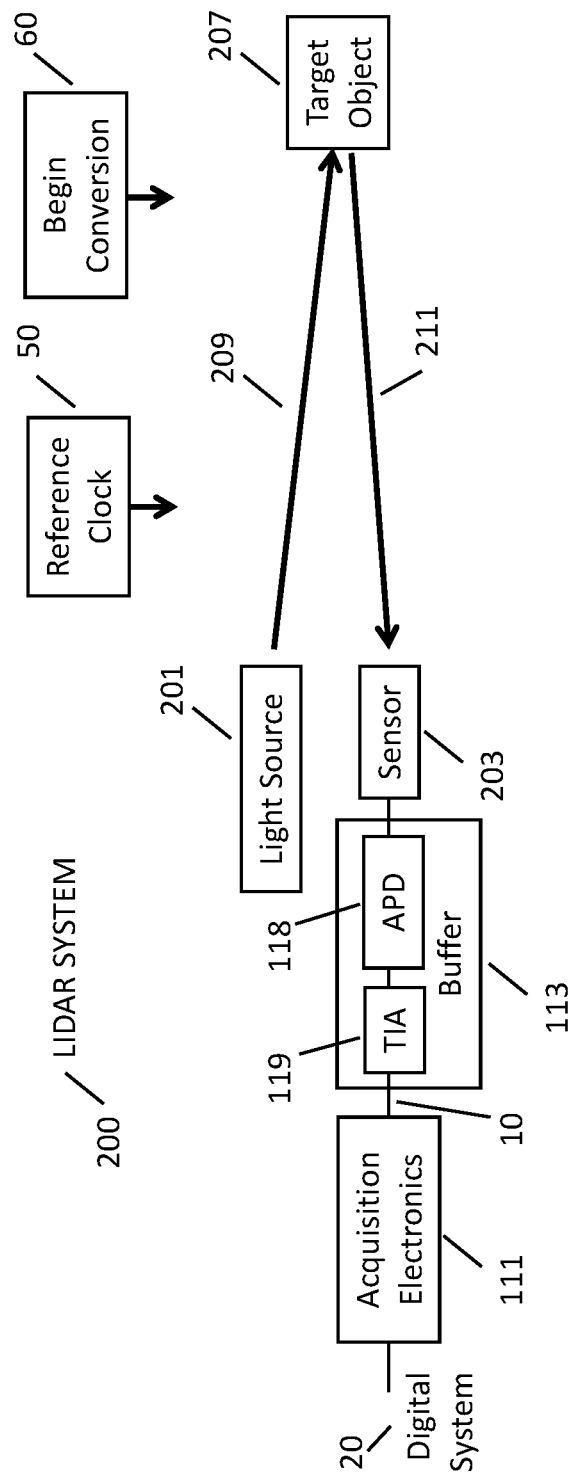
FIG. 2 illustrates a simplified block diagram of a Lidar System.

With reference to FIG. 2, a conceptual block diagram of a Lidar System 200 is shown. Lidar is a remote sensing method that uses light in the form of a pulsed laser to measure distances from a reference position to a Target Object 207. A Light Source 201 sends pulses of light that travels a first distance 209 to the Target Object 207. The light reflects off the Target Object 207 and travels a second distance 211 back to a Sensor 203 that outputs a signal representative of the detected reflected light, the output signal may be a current that may be input to a Sensor Interface Buffer 113, and the output of Buffer 113 may be input to Acquisition Electronics 205. Sensor Interface Buffer 113 may include an avalanche photodiode (APD) 118 or other device with current gain and a TIA 119. By measuring the delay from when the Light Source 201 transmits the laser signal to when the reflected signal is received by the Sensor 203, an estimate of the distance of the Target Object 207 can be calculated. Since light travels approximately 3×10^8 meters/sec, if a Target Object 207 is 300 meters from a light source 201, it takes approximately 2 microseconds for light sent from a light source 201 to reflect off a Target Object 207 and return back to a sensor 203. In an embodiment of a Lidar System 200, the Begin Conversion 60 signal may become active when the Light Source 201 transmits a pulse of light. Acquisition Electronics 205 may then be used to measure time from the Begin Conversion 60 signal transition to receiving the reflected light received by Sensor 203. The numbers used for the speed of light, distance of the object, and time delay are approximate and used to provide an example of the approximate time delays that may be measured by a Lidar system. In an embodiment, the Begin Conversion 60 signal may be replaced by a TRIGGER signal.

Applications such as particle accelerator systems and lidar systems may have a number of similarities. First, acquisition electronics 111 may have analog input 10 from a sensor, and digital output 20 which may be transferred to the digital system for further processing, storage, display, and other post processing operations. Second, a discrete observation period for observing the sensor data may be defined with a well-defined beginning and a well-defined end. There may be little or no value in evaluating the sensor data outside the observation period. And third, data may be sparse. A system in which data is sparse may be described as follows. During the majority of the observation period, the sensor output may be zero-valued or unchanging in value. When the sensors do receive non-zero or time-varying data, the period of time the data is non-zero or time-varying may be relatively short compared with the observation period.

In order to meet requirements for particle accelerator systems and lidar systems, the data acquisition system may provide: a. Digitized data—active portions of the signal may be converted into digital representation with moderate resolution and high sample rate; In some applications, 8-bits to 12-bits of resolution and sample rates up to 10 GHz or higher may be used; Other applications may have differing requirements; Only the time-varying portion or active portion of the signal may be digitized; and b. Timing info— provide sufficient data to enable the identification of the position of a signal occurrence in time relative to a timing reference; Some applications may require timing accuracy on the order of tens of picoseconds; Other applications may have differing requirements; In an application, the system may convolve the received signal with the impulse response of the expected signal and enable accurate identification of the time position of the received signal relative to a timing reference. Other applications may utilize other methods for identification of the time position of the received signal relative to a timing reference.

Figure 3:
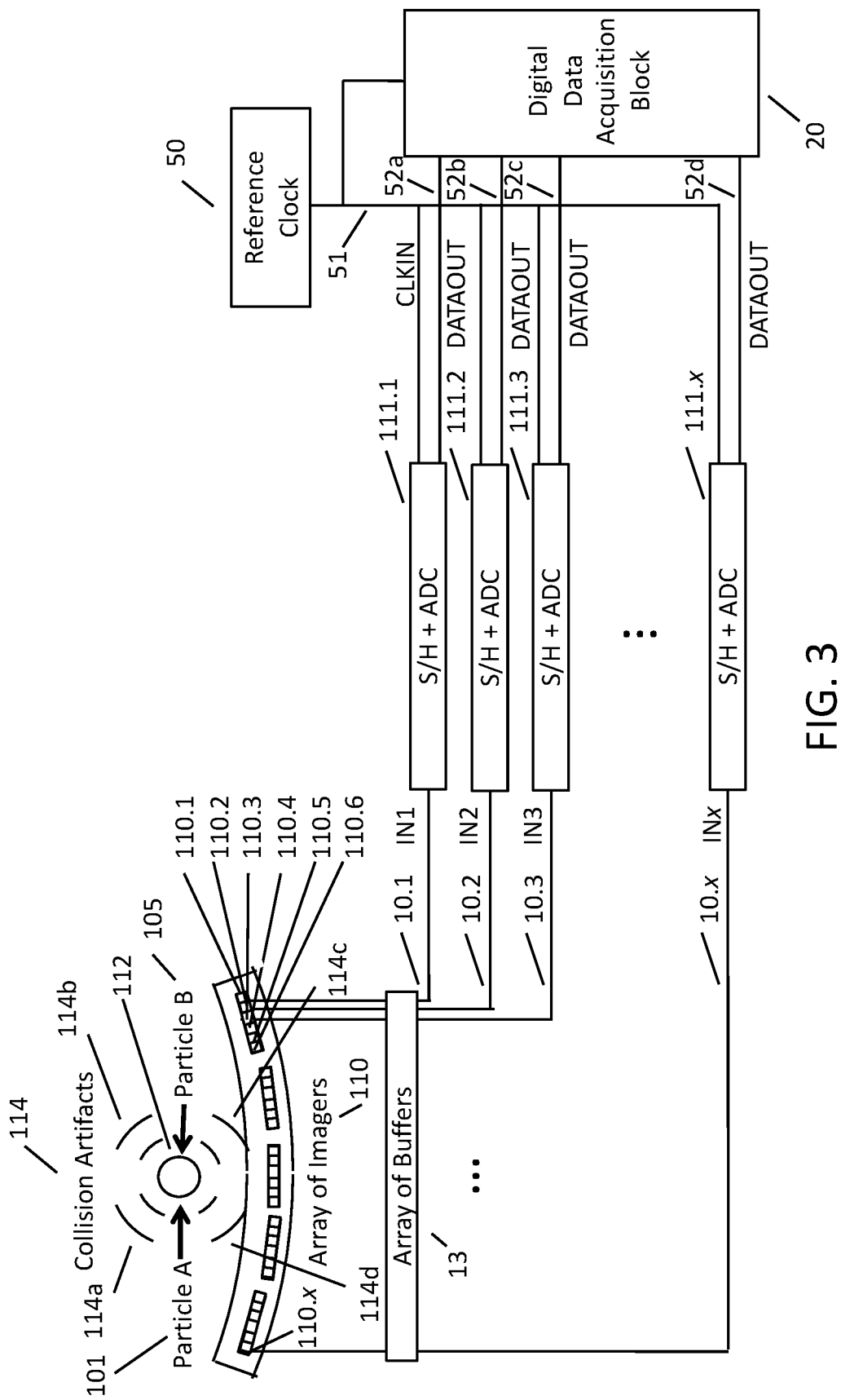
FIG. 3 illustrates a block diagram of a Particle Accelerator System utilizing a multiplicity of sensors and a multiplicity of data acquisition circuits.

With reference to FIG. 3, a collision detection system including electronics to detect and digitally record the collision and artifacts for analysis and study. The system may be designed to record a collision between a Particle A 101 and a Particle B 105 that may generate collision artifacts 114 that may disperse in different directions 114a-114d. An array of imagers 110 containing a multiplicity of image sensors 110.1-110x may be positioned to capture the collision 112 and the resulting artifacts 114. A first image sensor 110.1 may connect through a buffer within an array of buffers 13, to IN1 10.1 of data acquisition channel 110.1 containing a sample-and-hold (S/H) circuit and an analog-to-digital converter (ADC). Said buffer within the array of buffers 13 may include an avalanche photodiode or other device with current gain and may include a TIA. A reference clock 50 may provide the reference clock or CLKIN 51 to each data acquisition channel 111.1 and the Digital Data Acquisition Block 20. CLKIN 51 may be at the full system sample rate which may be in the Giga-Hertz frequency range. Alternatively, CLKIN 51 may be a lower frequency and a phase-locked loop (PLL) may multiply this frequency for sampling and data conversion. Each of the image sensors in the array of imagers 110 may be connected to a data acquisition channel 111a-111d. The array of imagers 110 may contain tens of imagers, hundreds of imagers, thousands of imagers, or even tens-of-thousands of imagers. With each imager 110a-110g connecting to a dedicated data acquisition channel 111a-111d, several challenges may arise.

Challenges of implementing data acquisition electronics using the approach illustrated in FIG. 3 include the following. First, ADCs sampling at frequencies of 1 GHz and higher consume high current. Second, high-speed ADCs must transfer data to the Digital Data Acquisition Block 20 at high speed. Third, data comes from each of the data acquisition channels 111a-111d and physically managing the routing from each of the channels to the Digital Data Acquisition Block 20 may be very difficult. Fourth, the signals from the sensor are non-zero only for short periods of time. In some applications, the sensors are non-zero for periods of time lasting nano-seconds or tens- of nano-seconds. Much of the data received and stored by the Digital Data Acquisition Block 20 may be zero or near zero resulting in a need to then comb through the acquired data to find the non-zero data. And fifth, if the CLKIN 51 is in the Giga-Hertz range, it can be difficult to distribute such a high-frequency clock and the current consumption to do so may also be high.

Figure 4:
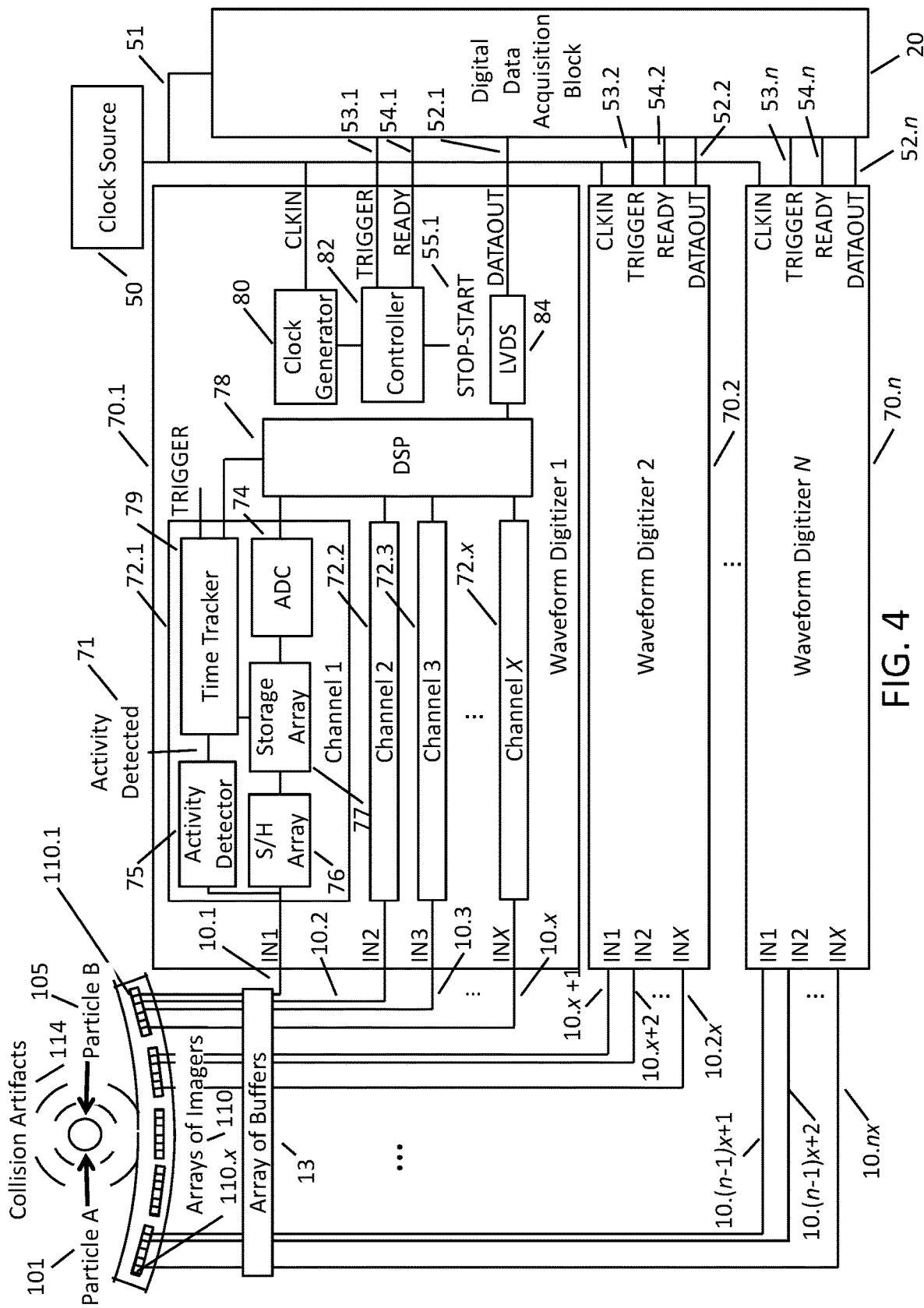
FIG. 4 illustrates a block diagram of a Particle Accelerator System using a multiplicity of waveform digitizers that simultaneously process inputs from a multiplicity of sensors.

With reference to FIG. 4, an embodiment of the invention is shown including a multiplicity of waveform digitizers 70.1, 70.2, 70n. Each waveform digitizer 70.1, 70.2, 70n may couple to a sensor interface buffer in an array of buffers 13, and each sensor interface buffer may couple to an image sensor in an array of imagers 110. A CLKIN 51 signal may be provided by Clock Source 50 and be distributed to each of the waveform digitizers 70.1, 70.2, 70n. A Digital Data Acquisition Block 20 may couple control signals including TRIGGER 53 and READY 54 to each waveform digitizer 70.1, 70.2, 70n, and receive DATAOUT 52 from each waveform digitizer. With reference to Waveform Digitizer 1 70.1, each of inputs IN1 10.1 through INX 10.x may connect to Channel 1 72.1 through Channel X 72.x with IN1 10.1 connecting to Channel 1 72.1, IN2 10.2 connecting to Channel 2 72.2, and so forth. Each channel may include the main elements with reference to FIG. 6 of U.S. Pat. No. 10,715,166 including an activity detector 75, S/H Array 76, Analog Storage Array 77, ADC 74, followed by digital domain processing. The S/H Array 76 may be coupled to Analog Storage Array 77 through multiplexors and the Analog Storage Array 77 may be coupled to the ADC 74 through multiplexors or a selector. The multiplexors and selector are not shown on FIG. 4. The channel outputs may enter a DSP block 78 that may include data storage and implementation of digital signal processing algorithms. The output of the DSP block may be passed to LVDS driver block which transmits data as the DATAOUT 52.1 signal to the Digital Data Acquisition Block 20. A Clock Generator 80 may utilize the input reference clock CLKIN 51 and may include a delay-locked loop or a phase-locked loop and may generate the many clock waveforms required by the Waveform Digitizer 1 70.1. A Controller 72 may receive one or more reference clock inputs from the Clock Generator 80, receive input signals TRIGGER 53.1, and generate a READY 54.1 signal.

The TRIGGER 53.1 signal may be input to the Controller 82 block in each Waveform Digitizer 70.1-70.n to control the start of an observation period or the end of an observation period. At the end of an observation period, each of the samples in the Analog Storage Array 77 may be digitized by the ADC 74 and the digitized samples may be input to the DSP 78. When the ADC 74 is finished digitizing each of the samples in the Analog Storage Array 77, the READY signal 54.1 may be exerted to inform the Digital Data Acquisition Block 20 that data transfer through DATAOUT 52.1 may begin.

The architecture may utilize a high degree of parallel analog processing to achieve high throughput at a lower current consumption than conventional approaches utilizing at-speed ADCs. Time-interleaving parallel analog circuit stages may have a deleterious effect on the composite output signal due to component mismatch between parallel stages. Transistor characteristics such as threshold voltage and self-gain, and capacitor and resistor values may have mismatch from local processing variations which may result in variations in path gain, bandwidth, DC offset, and may vary the sampling phases between parallel signal processing paths.

In an embodiment, the DSP 78 may include data storage, coding, or digital signal processing. Data storage may allow the DSP to store digitized data from the ADC 74 and download this data to the Digital Data Acquisition Block 20 at a lower rate. Coding may be used to control DC content in the DATAOUT 52 signal. Coding may be used to provide error detection and error correction in the packets received by the Digital Data Acquisition Block 20. Digital signal processing functions within the DSP may include and may not be limited to linear and non-linear processing including DC offset correction, gain correction, and filtering or correlation. Signal processing in the DSP 78 may include Machine Learning (ML) algorithms to correct for non-idealities in the composite output signal from mismatches in the parallel processing stages including DC offsets, gain, and sampling errors.

The functionality included in the block diagram of Waveform Digitizer 1 70.1 may comprise a Waveform Digitizer functional block. These functions may be implemented on a single substrate on a high-intergration mixed-signal integrated circuit, may be implemented on multiple integrated circuit substrates and placed into a single package as a multichip module (MCM), may utilize chiplets, or may utilize other packaging technologies to implement a waveform digitizer with one or more inputs with performance benefits to simplify a system implementation. The sensor interface buffer that may include a device with current gain and a TIA may be one of many buffers contained in the array of buffers 13 and may be implemented using external components. In an embodiment, the TIA may be implemented with each channel on the same substrate in an integrated circuit. In another embodiment, an image sensor and a TIA may be implemented with each channel on the same substrate in an integrated circuit.

The Waveform Digitizer 1 70.1 may overcome challenges identified in the implementation described with reference to FIG. 3. First, the function of high rate sampling may be decoupled from the conversion rate of the ADC 74, allowing the implementation of a lower current ADC 74, resulting in a lower current implementation of the ADC 74 when compared with the conventional approach. Second, the Activity Detector 75 may identify acquired window samples with detected activity before transferring samples to the Storage Array 77, and may stop the further processing of window samples that may have little or no signal activity. This may significantly reduce the percentage of sample windows that may be digitized, and reduce the amount of data that may require transmission to the Digital Data Acquisition Block 20. Third, the ADC 74 conversion rate may be reduced and digitized data may be stored in the DSP 78 to be transferred at a later time, enabling data to be sent to the Digital Data Acquisition Block 20 at lower speed. This may reduce routing complexity and data bandwidth requirements on the DATAOUT 52a signal lines. And fourth, the READY 54 signal may provide a data hand-shaking protocol to be implemented between the Waveform Digitizer 70 and the Digital Data Acquisition Block 20. In an embodiment, other control signals may be utilized to facilitate transfer between each Waveform Digitizer 70 and the Digital Data Acquisition Block 20. In an embodiment, said control signals may include a data clock, data active, data received, and re-transmit. In an embodiment, said control signals may include other signals to affect efficient and reliable data transfer.

Figure 5:
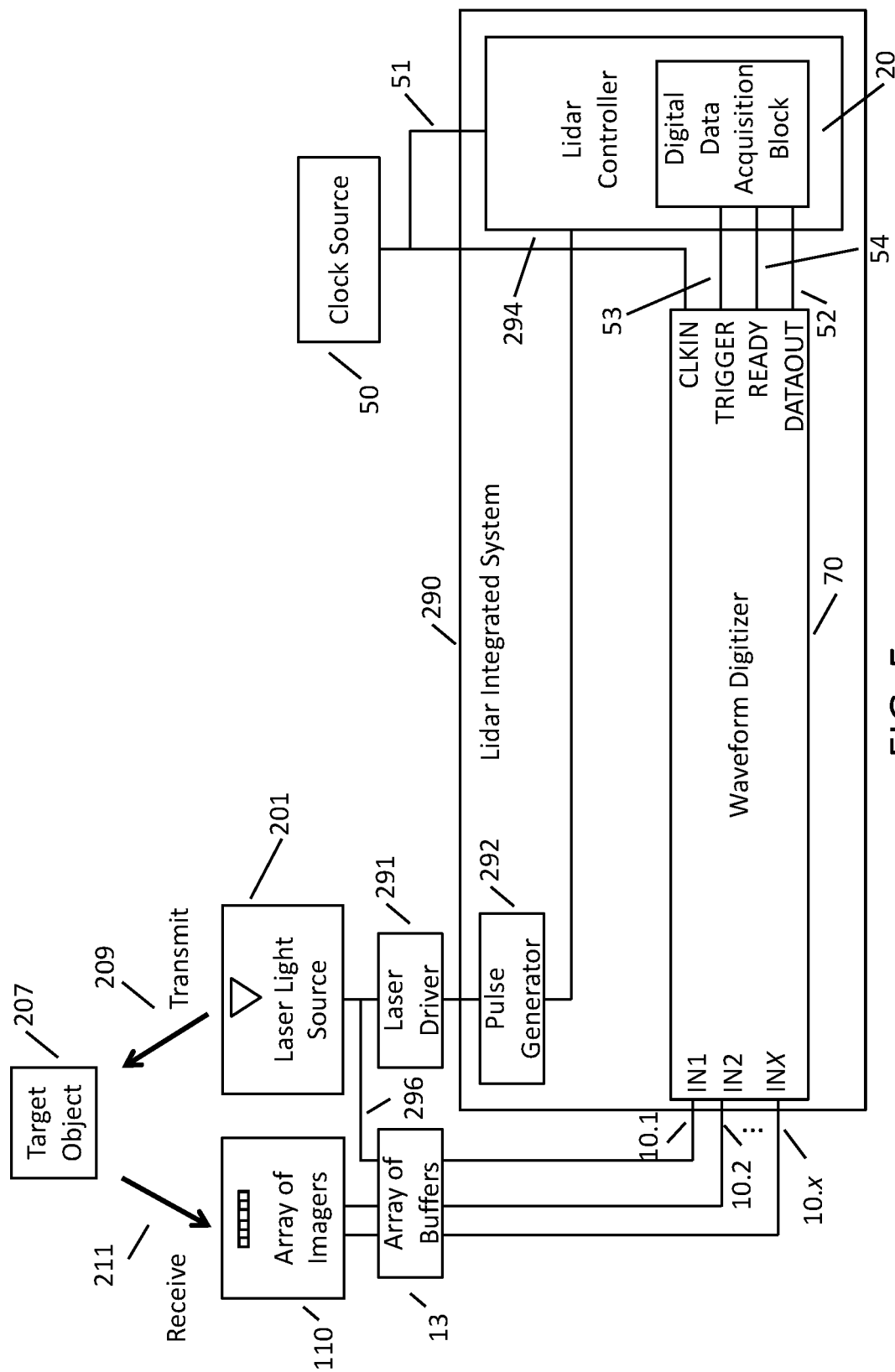
FIG. 5 illustrates a block diagram of a lidar system implementation wherein a waveform digitizer is integrated into a Lidar Integrated System.

With reference to FIG. 5, a block diagram of a lidar system is presented with waveform digitizer 70 integrated into Lidar Integrated System 290. In an embodiment, the light source sending transmit 209 light pulse may be a Laser Light source 201 driven by Laser Driver 291, the Laser Driver 291 may be driven by Pulse Generator 292 that may be time-synchronized to Clock Source output CLKIN 51, CLKIN 51 may be used as the reference clock to waveform digitizer 70, receive signal 211 may be reflected off Target Object 207 may be received by an array of imagers 110, each imager output signal may connect to a buffer in an array of buffers 13 wherein each buffer may be comprised of an avalanche photodiode (APD) or other device with current gain and a TIA connected to the output of said APD, the TIA may provide the buffer output and may connect to one of the Waveform Digitizer 70 inputs 10.2-10x. Laser Driver 291 output may provide laser driver reference 296 that may be input to a buffer within the Array of Buffers 13, the output of which may connect to IN1 10.1 of Waveform Digitizer 70, and may provide a time-reference pulse for a time measurement. The Waveform Digitizer 70 data output DATAOUT 52 may be input to the Digital Data Acquisition Block 20 that may reside in Lidar Controller 294.

In a first embodiment, CLKIN may be used as a time reference to initiate the transmit pulse to laser light source 201, and CLKIN may be used to latch the TRIGGER signal which may be used by the waveform digitizer to establish a time reference for waveform digitization. In said first embodiment, the lidar controller 294 may use the common time reference for the transmit pulse and the relative location in time of a received pulse from a channel to calculate roundtrip delay through a respective sensor path. In a second embodiment, the time-reference pulse provided by laser driver reference 296 and the relative location in time of a received pulse from a channel may be used to calculate roundtrip delay through a respective sensor path. In an embodiment, a laser driver may be integrated into a Lidar Integrated System 290. In an embodiment, a TIA for an image sensor may be integrated into a Lidar Integrated System 290. In an embodiment, an image sensor and TIA may be integrated into a Lidar Integrated System 290.

Figure 6:
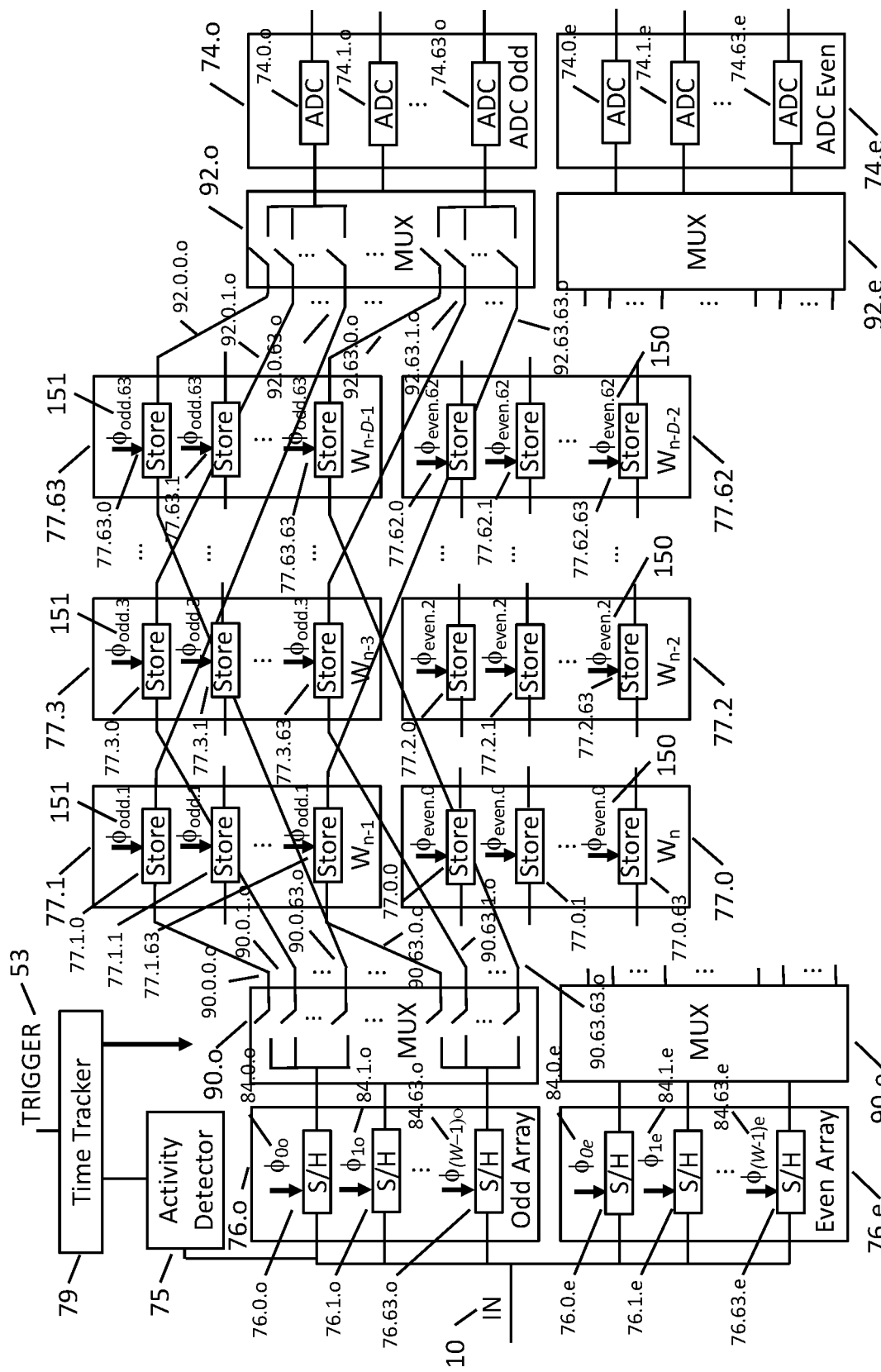
FIG. 6. presents a block diagram of a channel comprising time-interleaved sample-and-hold blocks through the ADC illustrating an embodiment of connectivity through the signal path.
Figure 7:
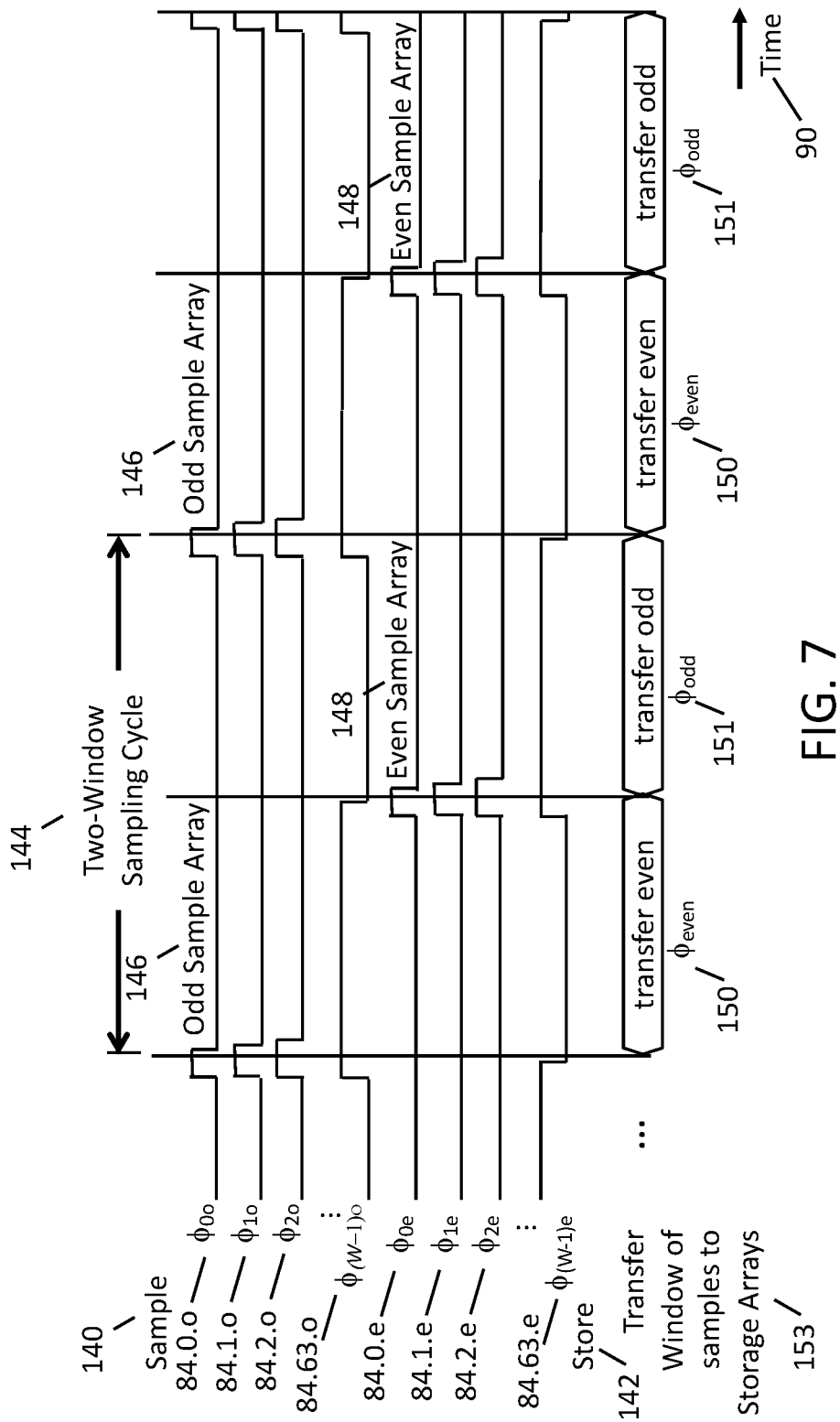
FIG. 7 illustrates a timing diagram for the channel shown in FIG. 6.

An embodiment of a channel is presented with reference to FIG. 6 and an illustrative timing diagram is presented with reference to FIG. 7. Two time-interleaved sampling arrays may include Odd Array 76.o which may include a window of S/H cells 76.0.o-76.63.o and Even Array 76.e which may include a window of S/H cells 76.0.e-76.63.e. The outputs of S/H cells 76.0.o-76.63.o in Odd Array 76.o may couple to multiplexing switches in MUX 90.o that may connect the Odd Array 76.o S/H cell outputs to storage windows in the upper row distinguished with storage cells clocked by $f_{odd}$ control clock phases. The outputs of S/H cells 76.0.e-76.63.e in Even Array 76.e may couple to multiplexing switches in MUX 90.e that may connect the Even Array 76.e S/H cell outputs to storage windows in the lower row distinguished with storage cells clocked by $f_{even}$ control clock phases. A second set of analog switches in a first MUX 92.o may connect the analog storage cell outputs in the Odd Array 76.o path to ADC array 74.o and a second set of analog switches in a second MUX 92.e may connect the analog cell outputs in the Even Array 76.e path the ADC array 74.e. Activity Detector 75 may couple to IN 10 and provide a signal to the Time Tracker 79 which may have TRIGGER 53 as a second input.

With reference to FIG. 7, a few of the clock signals are presented to illustrate operation of the channel described with reference to FIG. 6. A Two-Window Sampling Cycle 144 indicates two main phases: a first phase when the Odd Sample Array 146 is sampling wherein Odd Array 76.o is in sample mode and Even Array 76.e is in store mode, and a second phase when the Even Sample Array 148 is sampling wherein Odd Array 76.o is in store mode and Even Array 76.e is in sample mode. Each S/H cell may have an individual sampling clock 84.x.o, 84.x.e which may have two states: a logic 0 state and a logic 1 state. During the logic 1 state of the sampling clock, the sample-and-hold may track the input IN 10. On the transition from the logic 1 state to the logic 0 state, the sample-and-hold may acquire a sample that may be equal to the instantaneous value of IN 10 at the transition instant or sampling instant. There may be a window number of sampling phases 84.0.o-84.63.o for the Odd Array 76.o and a window number of sampling phases 84.0.e-84.63.e for the Even Array 76.e. Sampling clocks foo through $f_{(W-1)o}$ wherein W may be the window number of elements may transition to the logic 1 state at a substantially a similar time instant. This transition may be non-critical. The transition from logic 1 to logic 0 may be very critical. The time difference between transition instant for $f_{0o}$ to $f_{1o}$ may be similar to the transition instant between all adjacent sampling clocks and may define the sampling period wherein the sampling period may be the reciprocal of the sampling frequency. Transfer Even 150 and Transfer Odd 151 may operate in anti-phase with the sampling function. During the Odd Sample Array 146 sampling period, Transfer Even 150 may be active. During Even Sample Array 148 sampling period, Transfer Odd 151 may be active. When Transfer Even 150 is active, the fresh samples acquired by the Even Array 76.e may be transferred through MUX 90.e to one of the storage windows in the Even Array 76.e path. When Transfer Odd 151 is active, the fresh samples acquired by the Odd Array 76.o may be transferred through MUX 90.o to one of the analog storage windows in the Odd Array 76.o path. MUX 92.o and MUX 92.e may connect to the ADCs using a different set of clocks. The ADC Odd array 74.o may be shared by the odd index storage windows. The ADC Even array 74.e may be shared by the even index storage windows.

Figure 8:
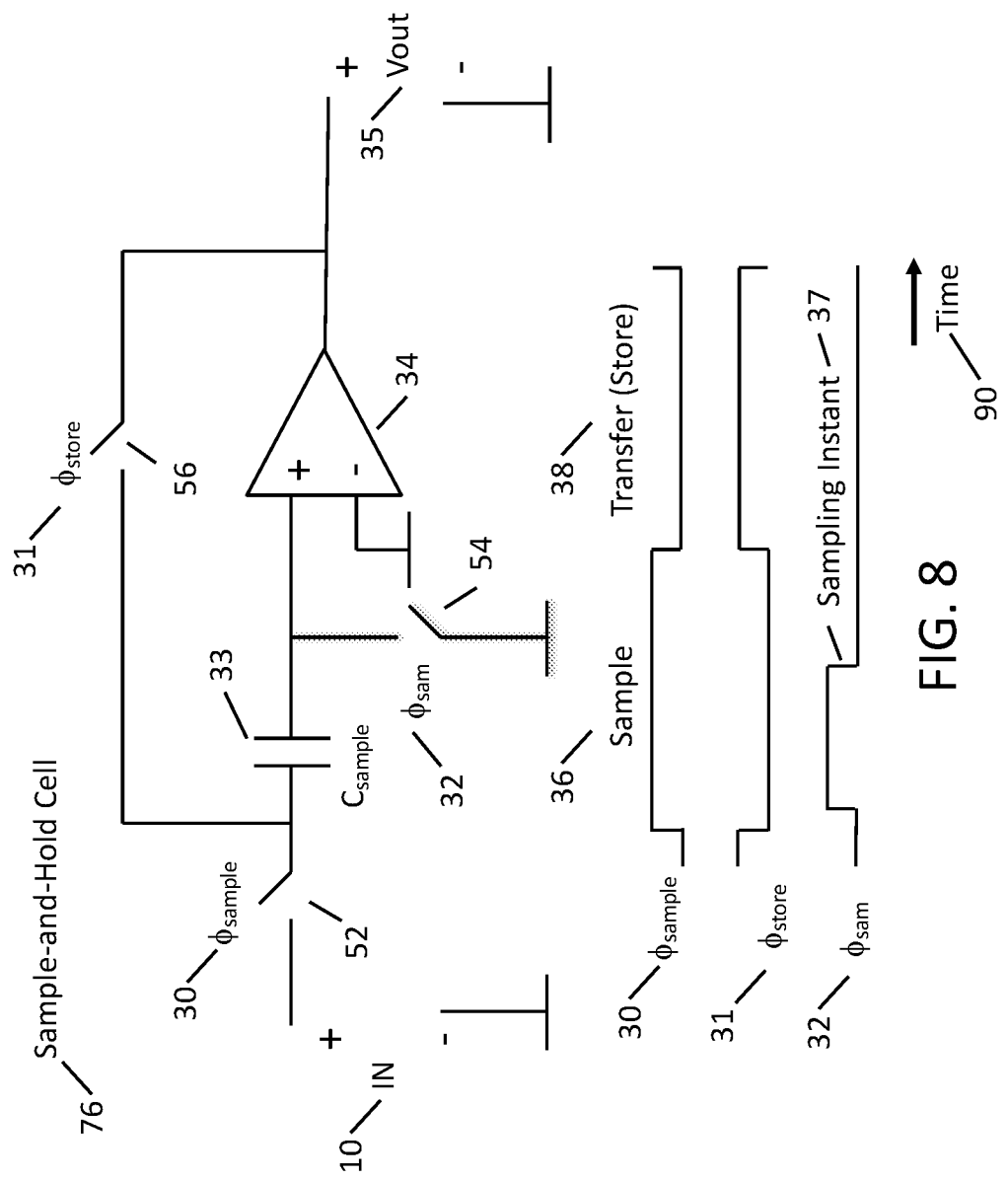
FIG. 8 illustrates a block diagram of a sample-and-hold circuit utilizing bottom-plate sampling.

With reference to FIG. 8, an embodiment of a S/H cell 76 is presented utilizing a bottom-plate sampling architecture. In the sampling phase, $f_{sample}$ 30 may become a logic 1 turning on switch 52 and when $f_{sam}$ 32 also becomes logic 1 turning on switch 54, IN 10 connects to the top plate of $C_{sample}$ 33 through the switch 52 while the bottom plate may be connected to GND through the bottom-plate switch 54. When $f_{sam}$ 32 transitions to logic 0 turning off switch 54, the sampling instant 37 may be defined and a sample of IN 10 may be acquired on $C_{sample}$ 33. When $f_{sample}$ 30 transitions to logic 0 turning off of switch 52, $f_{store}$ 31 may transition to logic 1 turning on switch 56. After a short settling time, the input voltage sampled on capacitor $C_{sample}$ may appear at Vout 35. Output Vout 35 may connect to a sampling capacitor in the front end of a storage cell through a switch, and may define the second phase as the transfer or store phase.

Figure 9:
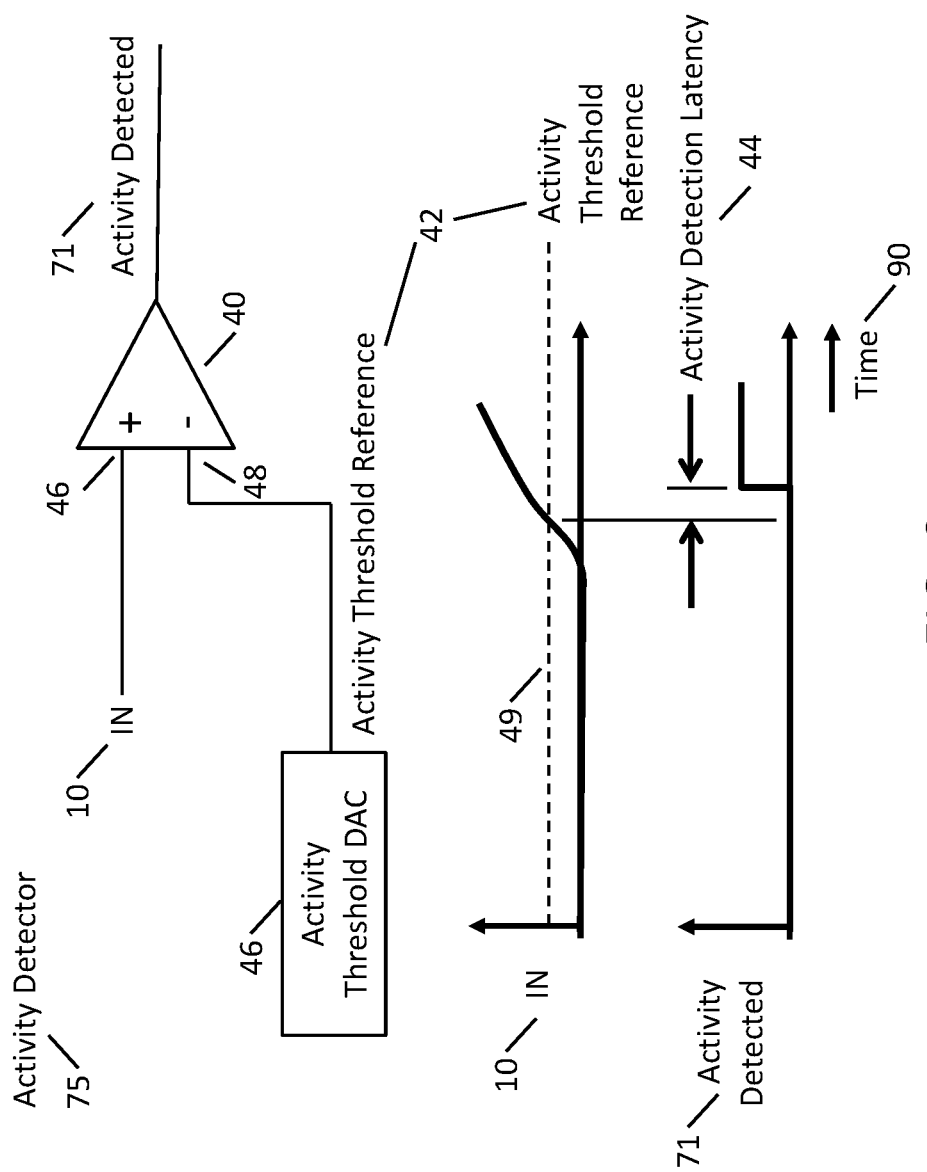
FIG. 9 illustrates a conceptual schematic of an Activity Detector circuit and the practical implementation aspect of comparator delay manifesting as Activity Detection Latency.

With reference to FIG. 9, an embodiment of an Activity Detector 75 is presented using a simple comparator circuit 40. An Activity Threshold Reference 42 may be provided by an Activity Threshold DAC 46. The plus terminal 46 of the comparator may be connected to IN 10 and the minus terminal 48 may be connected to the Activity Threshold Reference 42. With reference to the plots of signals versus time 90, in the upper plot the input signal IN 10 is presented together with a dashed line 49 representing the Activity Threshold Reference 42, and in the lower plot, the Activity Detected 71 signal is presented. When IN 10 becomes greater than the Activity Threshold Reference 42, the Activity Detected 71 signal may transition from logic 0 to logic 1. The Activity Detection Latency 44 may be the delay between IN 10 becoming greater than the Activity Threshold Reference 42 and the Activity Detected 71 signal transitioning to logic 1.

Figure 10:
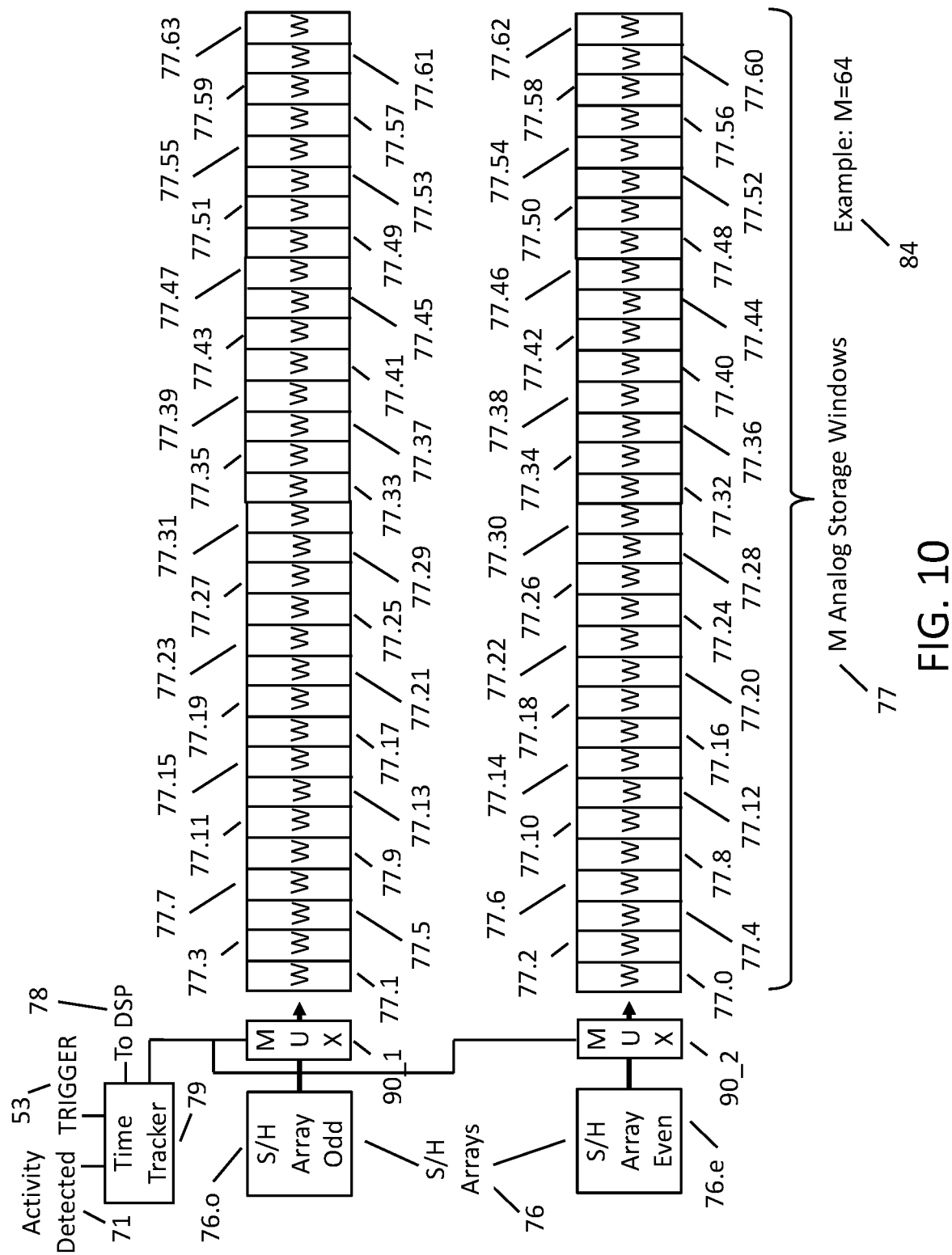
FIG. 10 illustrates the path of time-interleaved sampling arrays through multiplexors controlled by the Time Tracker transferring samples to storage windows W.

With reference to FIG. 10, S/H Arrays 76 are presented on the left and M 84 storage windows, each represented by a rectangular box and with a letter "W" 77.0-77.63 are presented on the right. In an embodiment, M 84, the number of storage windows in the analog storage array 77 is 64. In an embodiment, M 84 may be less than 64. In another embodiment, M 84 may be greater than 64. During each Two-Window Sampling Cycle 144, freshly acquired samples are transferred to a pair of storage windows; one from the S/H Array Odd 76.o and the other from the S/H Array Even 76.e. For example, in a first two-window sampling cycle 144, fresh samples may be transferred into storage window 77.0 and storage window 77.1, in a second two window samplne cycle 144, fresh samples may be transferred into storage window 77.2 and storage window 77.3, and so forth.

Figure 11:
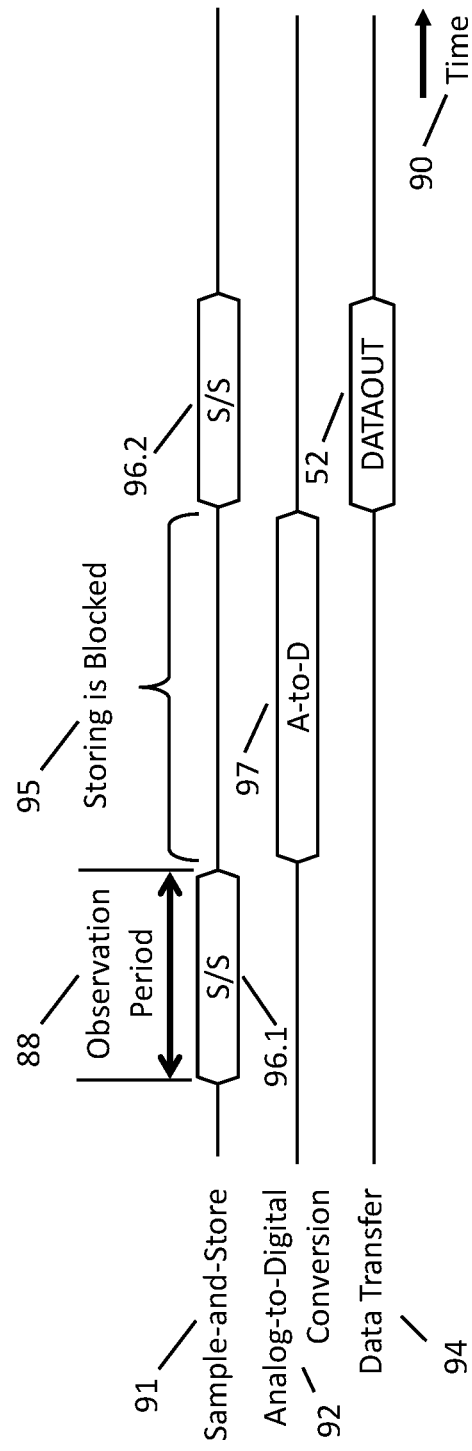
FIG. 11 presents a timing diagram of the operation of FIG. 10 and illustrates storing being inhibited during analog-to-digital conversion.

With reference to FIG. 11, the relative timing relationship of three functions versus time 90 is presented including Sample-and-Store 91, Analog-to-Digital Conversion 92, and Data Transfer 94 to the Digital Data Acquisition Block 20. In FIG. 11, a flat horizontal line may indicate that a function is inactive. Sample-and-store is indicated as active by S/S 96.1 for a duration of the Observation Period 88. At the end of S/S 96.1, the storage windows 77.0-77.63 may be full of freshly acquired samples, at that time samples may be converted into digital format by the Analog-to-Digital Conversion 92 presented as A-to-D 97. The duration of A-to-D 97 may include the time it takes to convert stored samples from all storage windows into the digital domain, which may also include the time it takes to move the digital domain samples into the DSP 78. In an embodiment, during the A-to-D 97 conversion period, there may be a constraint that Storing is Blocked 95. The storage windows may be connecting to the ADC for digitization of samples during A-to-D 97, making the storage windows unavailable for transferring and storing samples during A-to-D 97. When A-to-D 97 is completed, acquiring new samples S/S 96.2 may resume and the Transfer Data 94 may occur as indicated by DATAOUT 52 shown as active.

Figure 12:
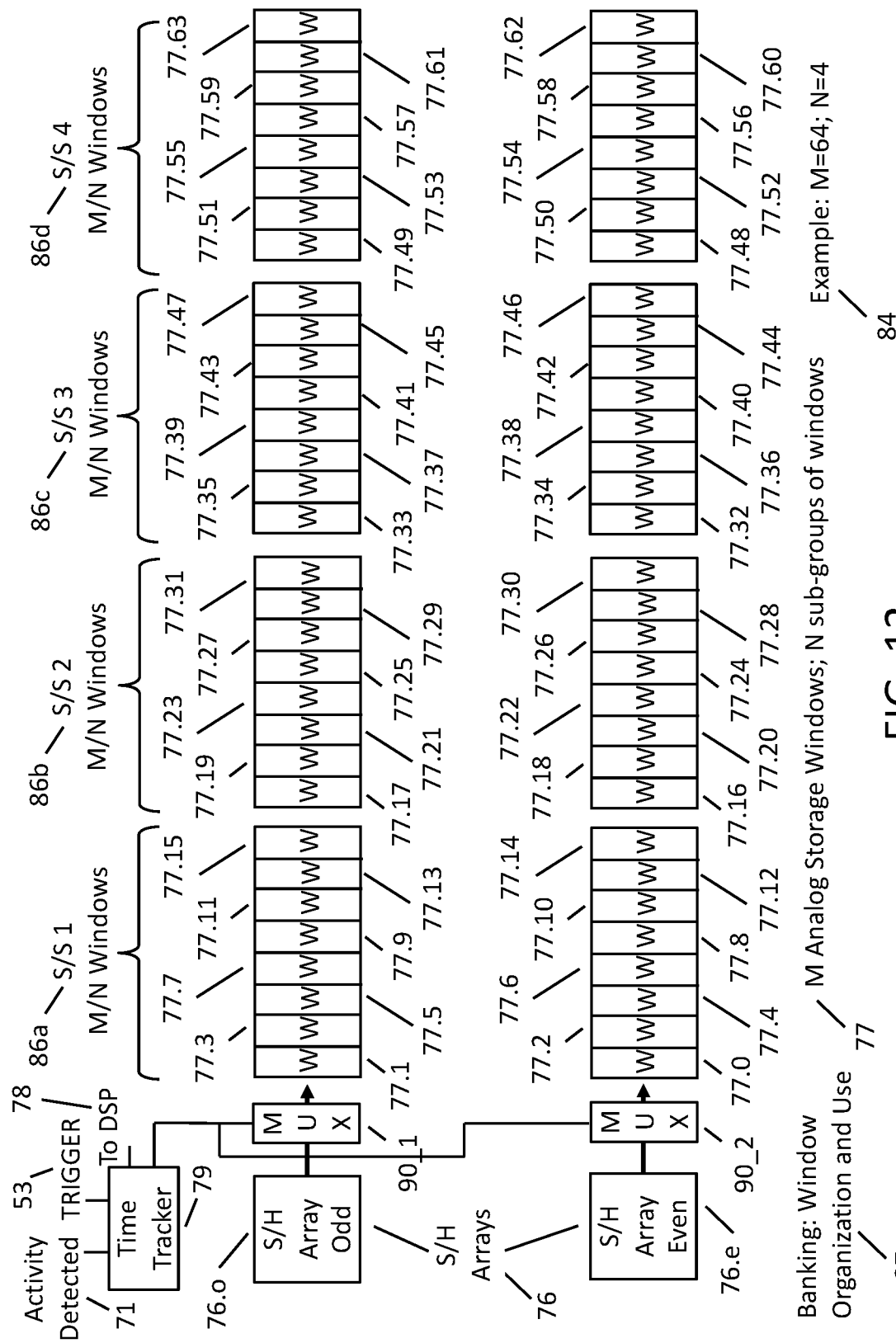
FIG. 12 illustrates the principle of banking wherein the analog storage array is partitioned into window sub-groups.

In an embodiment, an approach that may be referred to as banking may be utilized. With reference to FIG. 12, banking 87 is presented. In banking 87, windows may be separated into window subgroups. Window subgroups may be of equal size. For example with reference to the figure, M 77 windows with M equal 64 may be separated into subgroups of M/N windows with N=4 resulting in four subgroups of 16 windows. In an embodiment, the subgroup sizes may be equal. In another embodiment, the subgroup sizes may not be equal. In another embodiment, the subgroup size may be programmable. With banking 87, a window subgroup is a fraction of the Storage Array window size resulting in a shorter Sample-and-Store 90 period than when banking is not utilized. The Sample-and-Store 90 period with banking may include the time taken to acquire a fresh set of samples into a window subgroup and may comprise a Fractional Observation Period.

Figure 13:
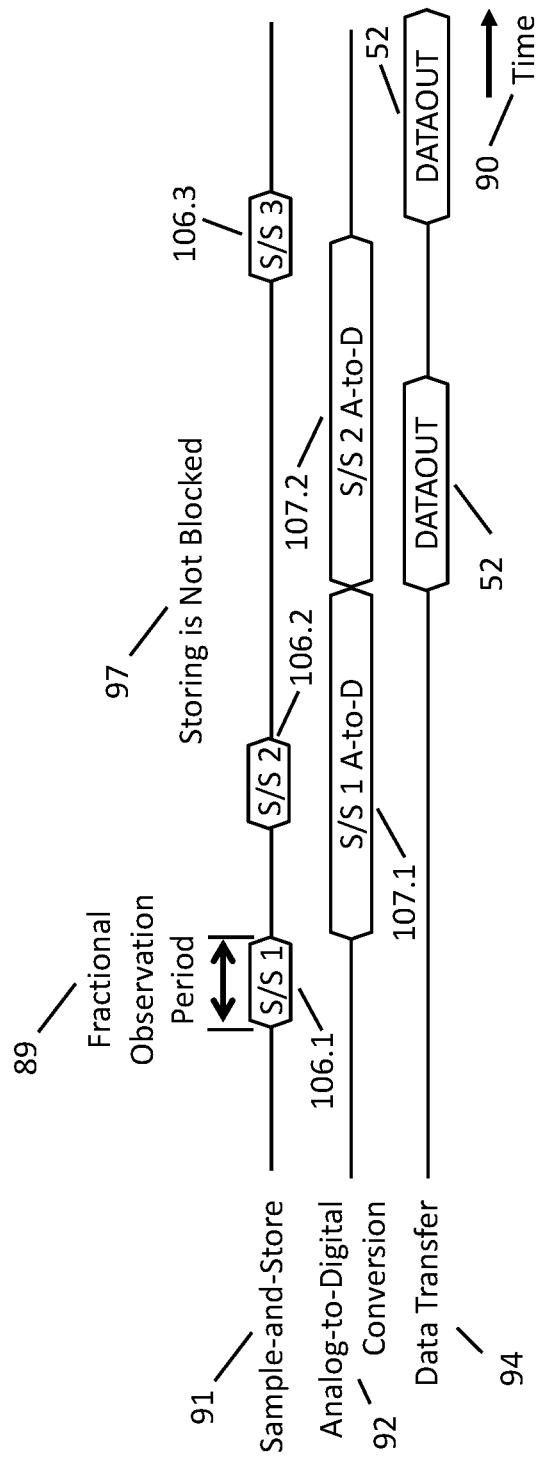
FIG. 13 illustrates a timing diagram of the operation of FIG. 12 and presents banking allowing a window sub-group to sample and store while another window sub-group is connected to the ADC.

With reference to FIG. 13, the relative timing of Sample-and-Store 90, Analog-to-Digital Conversion 92, and Transfer Data 94 is shown as a function of time 90. A Fractional Observation Period 89 is shown as S/S 1 106.1. When S/S 1 106.1.1 is complete, the digitization of the stored samples by the ADC may occur as indicated by S/S 1 A-to-D 107.1. However, unlike the case shown in FIG. 11, Storing is Not Blocked 97 during the active periods of the ADC. During the duration of S/S 1 A-to-D 107.1, input samples from the sampling array may be transferred to a subgroup of storage cells as indicated by S/S 2 106.2 indicated as active. Following completion of the conversion of S/S 1 106.1 into digital representation by the ADC as represented by S/S 1 A-to-D 107.1, conversion of S/S 2 106.2 into digital representation by the ADC may proceed as represented by S/S 2 A-to-D 107.2.

In an embodiment utilizing banking 87, a first sample-and-store cycle may utilize TRIGGER 53 to initiate transferring of samples from a sampling array to analog storage while the second and subsequent sample-and-store cycles my utilize the Activity Detector 75 to initiate transferring of samples from the sampling array to analog storage. In an embodiment, utilizing banking, the Activity Detector 75 may be used to initiate all transferring of samples from the sampling array to analog storage. In another embodiment utilizing banking, the TRIGGER 53 input may be used to initiate all transferring of samples from the sampling array to analog storage. In another embodiment, both TRIGGER 53 and the Activity Detector 75 may be used to initiate transferring samples from the sampling array to analog storage.

In an embodiment, the front-end of a channel 72 including the S/H Array 76 and Storage Array 77 may have two operating modes, a first Idle mode, and a second Sample-and-Store mode. In said sample-and-store mode, fresh samples are acquired and stored into storage windows. In said idle mode, the channel 72 front-end may be awaiting input activity to be detected by the Activity Detector 75 or the channel 72 front-end may be awaiting a TRIGGER 53 signal. With reference to FIG. 14-FIG. 16, three approaches that may be used to implement Idle mode are presented. With reference to FIG. 14, S/H Array Odd 76.o is shown with three storage windows 177.1-177.3. The letter p 178.0 is the storage array update index. In said figure that may illustrate a Sample-No Store Hold Pattern 170, a window of samples may be acquired during sample mode, and during the store mode, the S/H Array Odd 76.o may not be connected to any of the storage windows 177.1-177.3. If the Activity Detector may detect an activity in the input signal IN 10 during the sample mode, the system may transition to Sample-and-Store and the fresh samples may be transferred into a storage window in the Storage Array 77. However, with reference to FIG. 9, as the input signal IN 10 exceeds the Activity Threshold Reference 42, there may be an Activity Detection Latency 44 that may result in Activity Detected 71 transitioning to a logic 1 during the store mode. This delay may result in the acquired samples not being transferred to a storage window and samples may be lost.

With reference to FIG. 15, an embodiment of a Sample-Store Hold Pattern 180 is presented wherein in the absence of Activity Detected logic 1, a window of samples may be acquired during sample mode, and during the store mode, the S/H Array Odd 76.*o* may repeatedly transfer new samples to the same storage cells 177.1. In an embodiment, both S/H Array Odd 76.*o* and S/H Array Even 76.*e* may perform the sample-store hold pattern 180 in opposite phases of the Two-Window Sampling Cycle 144. As a result, samples from both S/H Arrays 76 taken during sample mode may always be stored into storage arrays during store mode. In an embodiment utilizing an Activity Detector 75 wherein the Activity Detector 75 monitors signal activity of the input IN 10, when activity is detected, or when TRIGGER 53 is activated, the system may transition out of the Sample-Store Hold Pattern 180 into a Sample-and-Store pattern. The Sample-Store Hold Pattern 180 may ensure no samples may be lost. In an embodiment, the Sample-Store Hold Pattern 180 may be use in an application of banking.

In an embodiment, a modification to an implementation of a Sample-Store Hold Pattern 180 may be implemented wherein during the store mode, the S/H Arrays 76 may transfer samples into more than one window of storage cells in a repeating sequence until TRIGGER 53 is activated or activity is detected by the Activity Detector 75. The modified implementation may be referred to as the Sample-Store Hover Pattern.

With reference to FIG. 16, a mode that may be referred to as Free-Run 190 is presented. On the left of the figure is the condition with p=1 wherein S/H Array Odd 76.*o* transfers fresh samples into storage window 117.3. In the center of the figure is the condition with p=2, S/H Array Odd 76.*o* transfers samples into storage window 117.2. Finally, on the right of the figure is the condition with p=3, wherein S/H Array Odd 76.*o* transfers samples into storage window 117.3. In Free-Run 190, the time-interleaved S/H Arrays systematically transfer samples to each of the available storage windows in sequence in a repeated manner.

Figure 17:
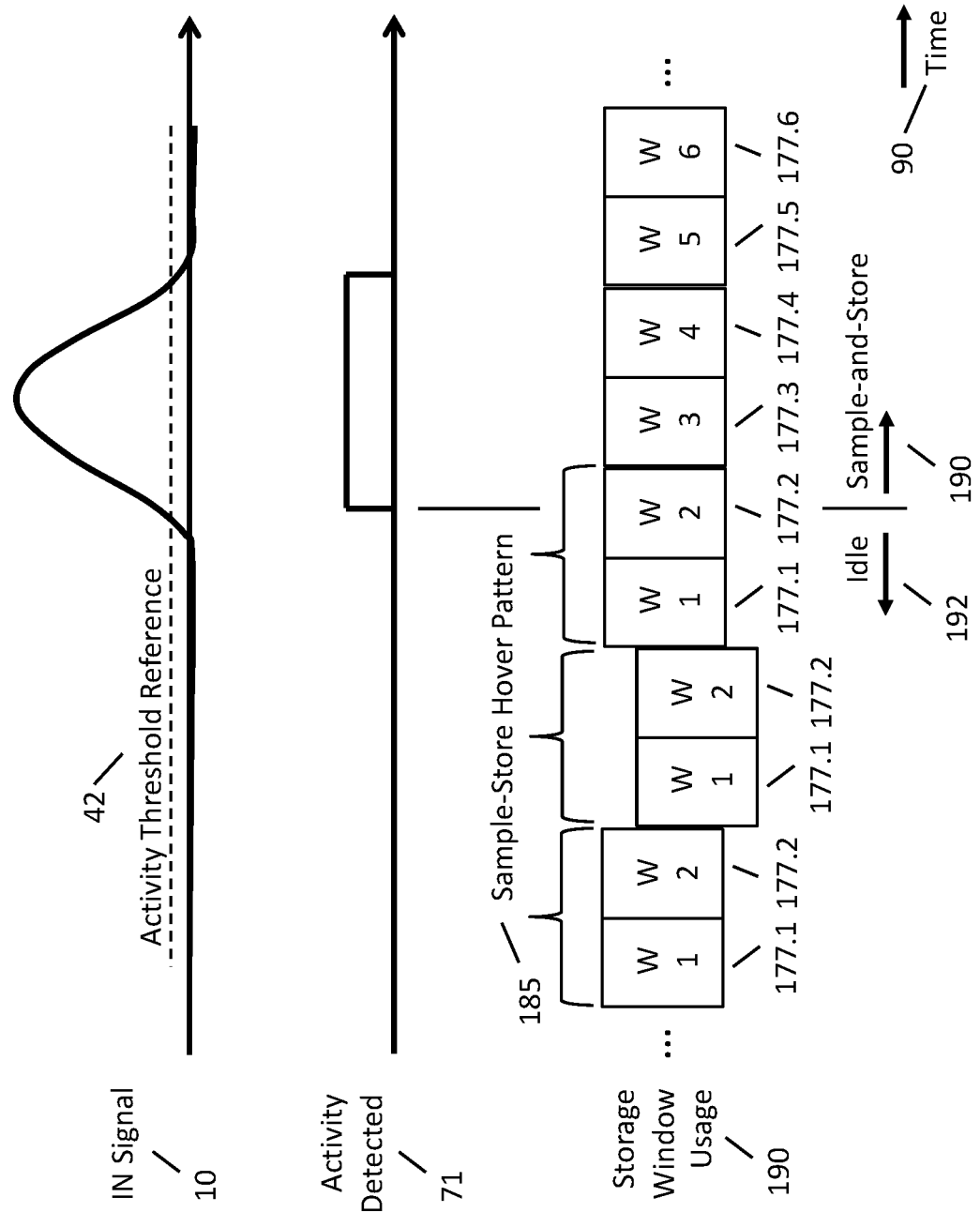
FIG. 17 presents an input signal, Activity Detected signal, and storage window usage versus time illustrating operation of the Sample-Store Hover Pattern.

With reference to FIG. 17, the IN signal 10, Activity Detected 71 signal, and storage window usage 190 are presented versus time 90 to illustrate window usage in an application of the Sample-Store Hover Pattern 180. In the period before Activity Detected is activated, the channel front-end may be in Idle 192 mode and a first set of acquired samples of the input may be transferred during a first store mode into storage window 1 177.1 then a second set of acquired samples of the input may be transferred during a second store mode into storage window 2 177.2, and this process may repeated. When IN 10 increases and exceeds the Activity Threshold Reference 42, Activity Detected 71 may transition to a logic 1, transitioning the Time Tracker from the Sample-Store Hover Pattern 185 to Sample-and-Store 190. After the transition into sample-and-store 190, following the transfer of acquired samples into Storage Window 2, samples may be subsequently transferred into Storage Window 3, and so forth.

Implementations of the Waveform Digitizer 70 may be parameterized for specific applications and use cases. Parameterizable elements may include structural elements and performance specifications. Structural elements may include sample rate, window size, storage window depth, and the number of integrated waveform digitizer channels 72. Performance specifications may include sampling bandwidth and ADC dynamic range or signal-to-noise ratio (SNR). Applications of particle collision detection may utilize sample rates from 1 GHz to 10 GHz, a window size of 64, a storage window depth of 64, and 16 channels 72. Applications of particle collision detection may utilize sample rates less than 1 GHz while other applications may utilize sample rates greater than 10 GHz; may utilize a window size of 32, while other applications may utilize a window size of 128 or greater; may utilize a storage window depth of 32, while other applications may utilize a window depth of 128 or greater; and may utilize 8 or fewer channels, while other applications may utilize 32 or more channels.

Applications of lidar may utilize sample rates from 125 MHz to 1 GHz, a window size of 64, a storage window depth of 64, and from 4 to 16 channels 72. A 1 GHz sample rate, window size of 64, and storage window depth of 64 may allow a distance measurement of approximately 600 meters. Transmit pulse widths used may be in the range between 20 to 30 nsec. In some applications, transmit pulse widths shorter than 20 nsec may be used. In other applications, transmit pulse widths greater than 30 nsec may be used. Sample rates on the order of 1 GHz may be attractive but due to the high current consumption of data converters at that speed, lower sampling rates may be used. Applications of lidar may utilize sample rates greater than 10 GHz; may utilize a window size of 32, while other applications may utilize a window size of 128 or greater; may utilize a storage window depth of 32, while other applications may utilize a window depth of 128 or greater; and may utilize 8 or fewer channels, while other applications may utilize 32 or more channels.

In an embodiment, a STOP-START 55 signal may identify a mode of operation of the Controller 82, Time Tracker 72, and the resulting waveform digitizer subsystem. In a first mode when STOP-START 55 is logic 0, exerting TRIGGER 53 may stop a sample-and-store sequence and define the end of an Observation Period. In a second mode, when STOP-START 55 is logic 1, exerting TRIGGER 53 may start a sample-and-store sequence and define the beginning of an Observation Period.

Figure 18:
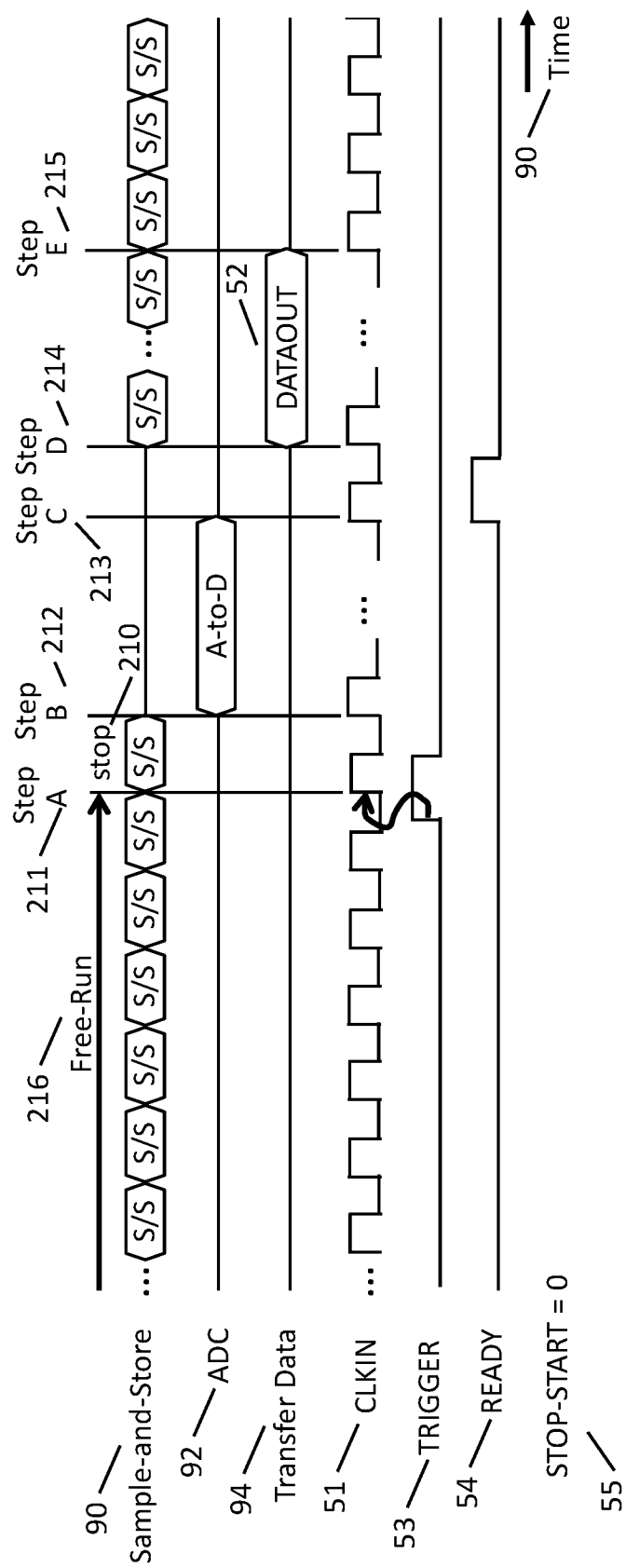
FIG. 18 illustrates a timing diagram for the condition wherein STOP-START logic 0 and the TRIGGER signal may be used to stop the process of sample-and-store.

With reference to FIG. 18, the STOP-START 55 signal is a logic 0. The channels may operate in Free-Run mode before TRIGGER 53 is exerted when STOP-START 55 is logic 0. This is illustrated as Sample-and-Store 90 active in Free-Run 216 mode. When TRIGGER 53 is asserted and latched by the rising edge of CLKIN 51, Step A 211 occurs wherein after one additional S/S period beyond the Observation Period 218 to accommodate the store mode for the last set of acquired samples. On Step B 212, the A-to-D conversion of the samples in analog storage may occur. On Step C 213, READY 54 signal may be asserted and sent to the Digital Data Acquisition Block 20. On Step D 214, Transfer Data 94 becomes active and DATAOUT 52 becomes active. Finally, on Step E 215, the transfer of data is complete and DATAOUT 52 is de-asserted.

Figure 19:
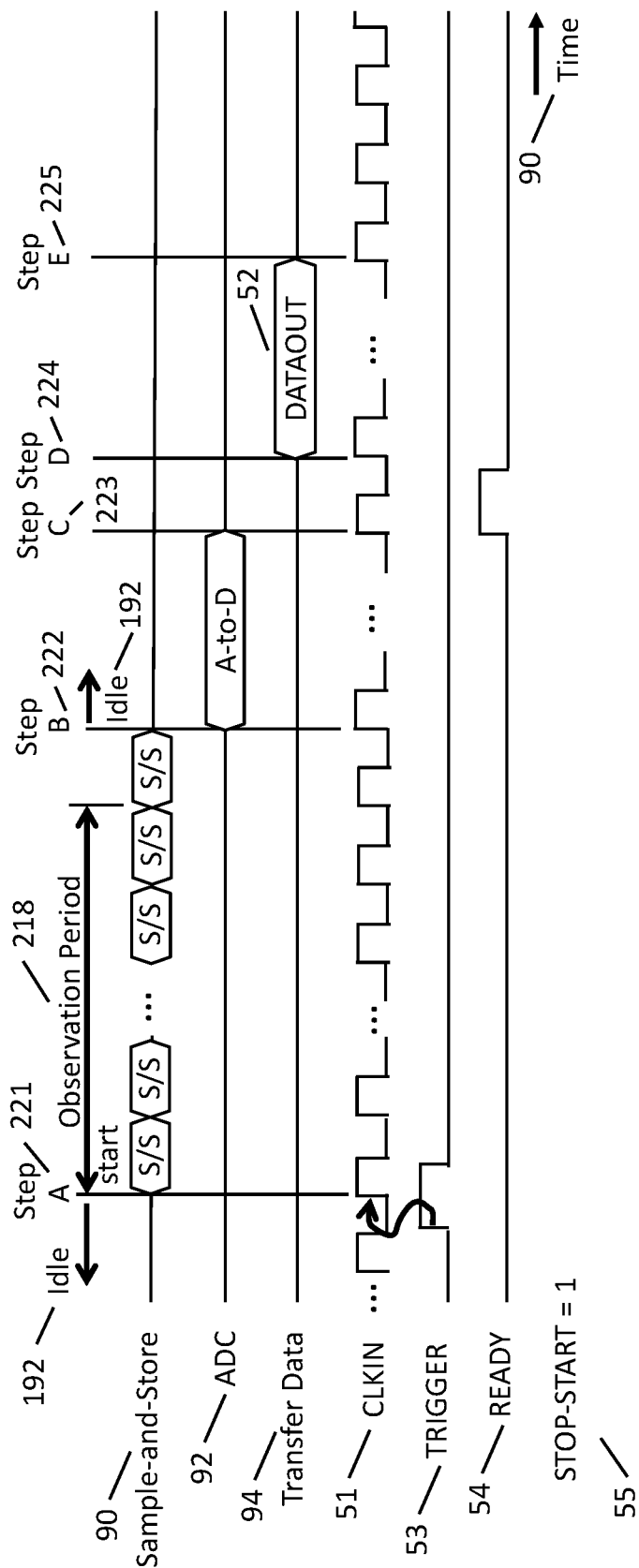
FIG. 19 illustrates a timing diagram for the condition wherein STOP-START logic 1 and the TRIGGER signal may be used to start the process of sample-and-store.

With reference to FIG. 19, the STOP-START 55 signal is a logic 1. The channels may operate in Idle 192 mode prior to when TRIGGER 53 is exerted. This is illustrated as Sample-and-Store 90 in-active during Idle 192 mode. When TRIGGER 53 is asserted and latched by the rising edge of CLKIN 51, Step A 211 occurs wherein a series of Sample-and-Store 90 cycles indicated as S/S occurs for the duration of an Observation Period 218. After one extra cycle of S/S to accommodate transferring the Even Array 76.*e* samples to the storage array 77, Sample-and-Store 90 may return to Idle 192 mode. On Step B 222, the A-to-D conversion of the samples in analog storage may occur. On Step C 223, READY 54 signal may be asserted and sent to the Digital Data Acquisition Block 20. On Step D 224, Transfer Data 94 may indicate DATAOUT 52 active. Finally, on Step E 225, the transfer of data is complete and DATAOUT 52 is no longer active. In an embodiment, a waveform sampling system may use TRIGGER 53 to stop or start samplingand-storing an observation period, depending on the logic state of a STOP-START 55 bit.

In an embodiment, the Activity Detected output of the Activity Detector may be used with the TRIGGER input in an application of the TRIGGER input. In an embodiment, the Activity Detected output of the Activity Detector may be used in place of the TRIGGER input in an application of the TRIGGER input. In an embodiment, the Activity Detected output of the Activity Detector may be used to end or stop a sample-and-store sequence.

Figure 20:
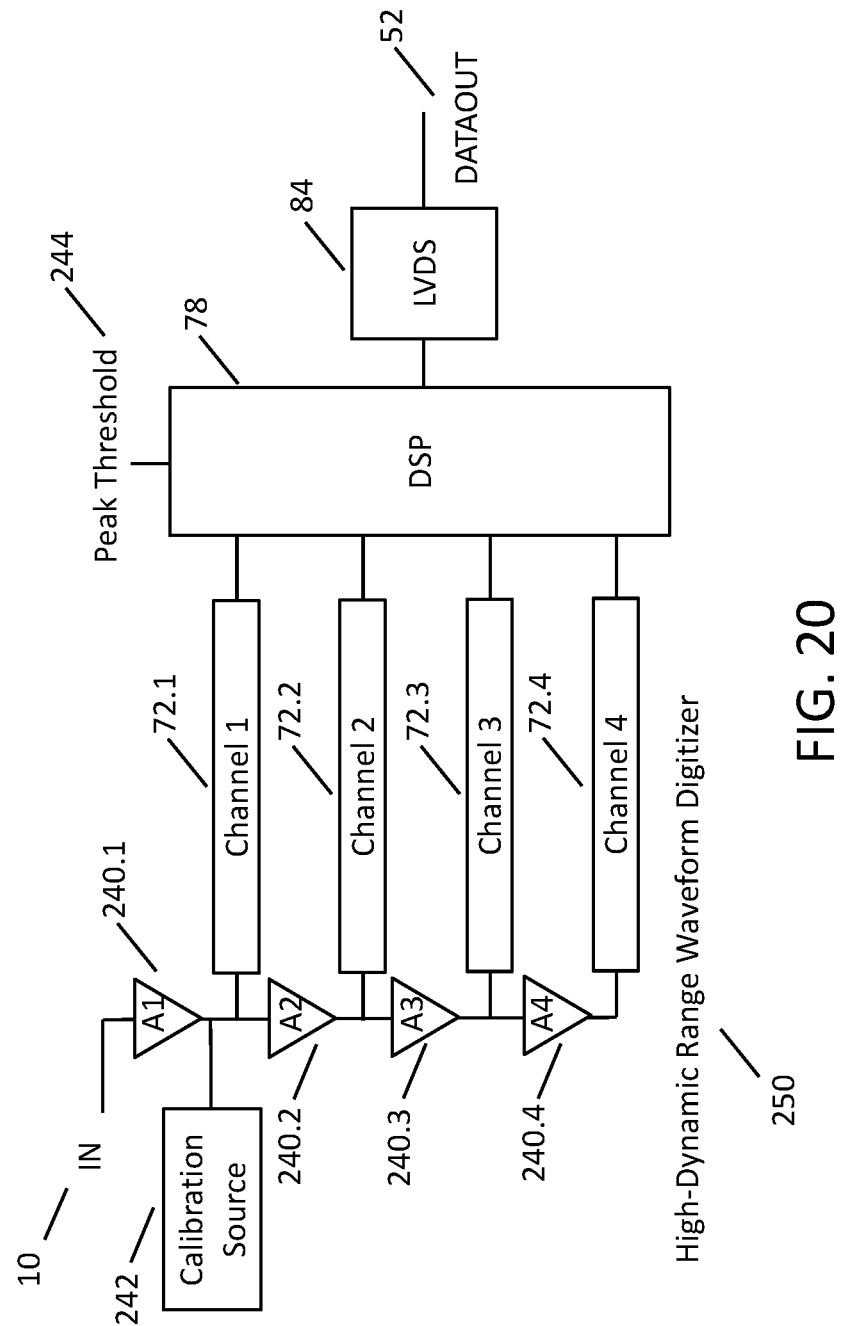
FIG. 20 illustrates a diagram of an embodiment of an architecture to achieve a high-dynamic range waveform digitizer.

In the application of lidar, dynamic range of the receive signal path may be a critical parameter. The farther an object is from the lidar system 200, the greater the attenuation may be of the return signal 211. With reference to FIG. 20, a multiplicity of interstage amplifiers 240.1-240.4 and a multiplicity of channels 72.1-72.4 may be combined to implement an extremely high-dynamic range waveform digitizer 250. Input 10 from the receive sensor 203 may be input to a first amplifier A1 240.1 with gain A1, the output of A1 240.1 may be input to Channel 1 72.1 and second amplifier A2 240.2 with gain A2, the output of A2 240.2 may be input to Channel 2 72.2 and third amplifier A3 240.3 with gain A3, the output of A3 240.3 may be input to Channel 3 72.3 and forth amplifier A4 240.4 with gain A4, the output of A4 240.4 may be input to Channel 4 72.4. In an embodiment, the high dynamic range system may use fewer than 4 amplifier stages and fewer than 4 channels. In another embodiment, the high-dynamic range system may use more than 4 amplifier stages and more than 4 channels. In an embodiment, amplifier A1 240.1 may have a gain greater than unity. In another embodiment, amplifier A1 240.1 may have a gain equal to unity. In another embodiment, amplifier A1 240.1 may have a gain less than unity. In another embodiment, amplifier A1 240.1 may have a gain that is programmable and which may be greater than unity, equal to unity, or less than unity. In an embodiment, amplifiers A2 240.2, A3 240.3, and A4 240.4 may each have a gain that is substantially similar or equal. In an embodiment, the gain of amplifiers A2 240.2, A3 240.3, and A4 240.4 may equal 5. In another embodiment, the gain of amplifiers A2 240.2, A3 240.3, and A4 240.4 may equal 6. In another embodiment, the gain of amplifiers A2 240.2, A3 240.3, and A4 240.4 may be less than 5. In another embodiment, the gain of amplifiers A2 240.2, A3 240.3, and A4 240.4 may be greater than 5. In another embodiment, the gains of amplifiers A2 240.2, A3 240.3, and A4 240.4 may be have different values.

In the high-dynamic range waveform digitizer 250, each of the channels 72.1-72.4 may utilize the same timing and all clock signals may be operated in a synchronous manner. In an embodiment, the high-dynamic range waveform digitizer 250 may utilize the TRIGGER 53 signal to initiate and synchronize sample-and-store within each of the channels. The high-dynamic range waveform digitizer may be used with the STOP-START 55 control bit. Under the condition STOP-START 55 is logic 0, the high-dynamic range waveform digitizer may Free-Run 190 until TRIGGER 53 is activated. Under the condition STOP-START 55 is logic 1, the high-dynamic range waveform digitizer 250 may sample-and-store until the available storage windows are filled with fresh samples.

In an embodiment of the high-dynamic range waveform digitizer 250, banking 87 may be utilized wherein Activity Detectors 75 may be utilized to initiate and synchronize a period of sample-and-store to fill window subgroups. In said embodiment, each Activity Detector 75 may communicate status to the other Activity Detectors 75 to initiate and synchronize sample-and-store based on the first activity detected signal activation. In said embodiment, each channel storage array may be separated into the same number of window subgroups, and all sample-and-store actions may be synchronized among each of the channels 72.1-72.4.

The Peak Threshold 244 is a parameter that may be a digital input, that may be provided relative to the ADC full-scale voltage. For example, if the ADC has a full-scale input voltage of 1V, peak threshold 244 may be the code equivalent to one-fourth of the full-scale input. The high-dynamic range waveform digitizer 250 may operate on samples of the IN 10 lasting an Observation Period. Consider peak threshold 244 set to one-forth ADC full-scale and the ADC full-scale to be 1V. Now consider an input signal with a maximum voltage over the duration of an Observation Period that is one-fourth ADC full-scale. The output of A2 240.2 may be 1.25V and the outputs of Channels 2 72.2 through Channel 4 72.4 may saturate. The DSP may observe each of the channel outputs and select the channel that is largest in magnitude while not having any of its samples exceed the peak threshold 244. In this case, since Channels 2 72.2 through Channel 4 72.4 may have saturated, the output of Channel 1 72.1 may be selected. The output of Channel 1 72.1 may be the only channel for which a sample exceeding the peak threshold 244 may be allowed. Next consider an input that has a maximum signal that is one-twentieth the ADC full-scale which would be 50 mV. This may be amplified by A2 240.2 and result in an input into Channel 2 72.2 of 250 mV. The output of A3 240.3 may be 1.25V and both Channel 3 72.3 and Channel 4 72.4 may saturate. The DSP may select the channel output that is largest without exceeding the peak threshold 244. Therefore, the Channel 2 72.2 output may be selected. Next consider an input that has a maximum signal that is one-five hundredth the ADC full-scale which would be 2 mV. The maximum signal at the output of A2 240.2 would be 10 mV, the maximum signal at the output of A3 240.3 would be 50 mV, and the maximum signal at the output of A4 240.4 would be 250 mV. In this case, the DSP may select the output of Channel 4.

The composite gain in the current example of the gain of A2, A3, and A4 all equaling 5, for a total gain of 5×5×5=125. If the ADC were an ideal 10-bit converter with an LSB of 1 mV, the high-dynamic range waveform digitizer 250 could resolve an input that is 1 mV/125=8 mV excluding noise and other non-idealities.

In a practical implementation, the gains may vary and each amplifier may add bandlimiting to the signal. One way to mitigate the effects of this is to perform a calibration. Calibration Source 242 may be used to input a calibration signal into the signal path near the input. In an embodiment, the Calibration Source 242 may input a calibration signal into the input node shared by Channel 1 72.1 and A2 240.2. Amplifier A1 240.1 may be powered-down and placed into a high-impedance output state. In an embodiment, the calibration signal may be a step voltage of 5 mV. In another embodiment, another calibration signal may be used and the maximum voltage of the calibration signal may be greater than 5 mV or the maximum voltage of the calibration signal may be less than 5 mV. In the case that the calibration voltage is a 5 mV step, the outputs of each of the channels may be analyzed to determine the gain of each of the amplifiers A2, A3, and A5. Further, the time domain response of the step may be analyzed to back out the group delay through each stage. The group delay is important to be factored into the delay of the signal passing through the different amplification stages of the high-dynamic range waveform digitizer 250.

Figure 21:
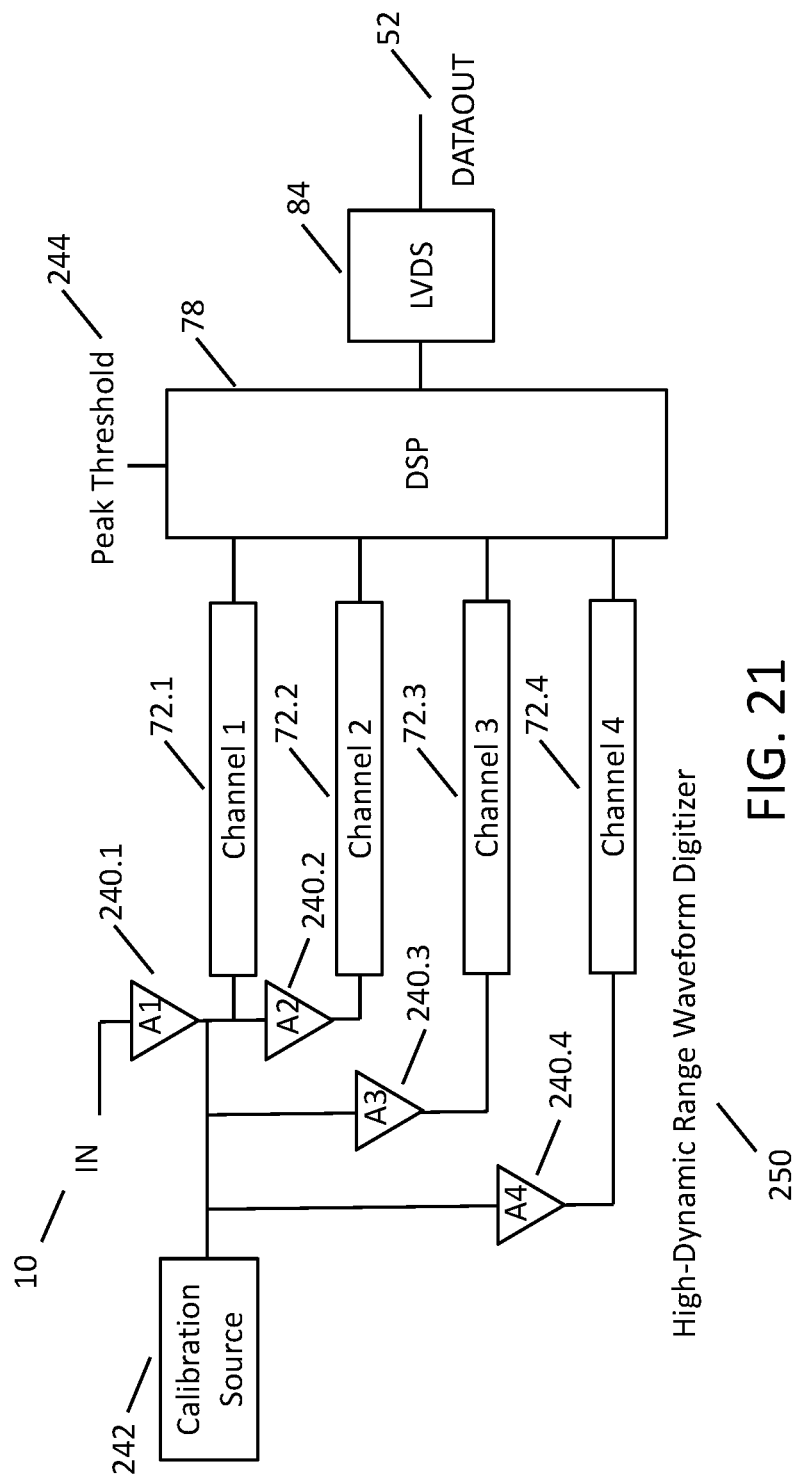
FIG. 21 illustrates a diagram of an alternate embodiment of an architecture to achieve a high-dynamic range waveform digitizer.

With reference to FIG. 21, an embodiment is presented wherein amplifier A2 240.2, amplifier A3 240.3, and amplifier A4 240.4 share the same input node and amplifier A3 240.3 may be designed to have a gain equal to the cascade of two amplifier A2 240.2 circuits, and amplifier A4 240.4 may be designed to have a gain equal to the cascade of three amplifier A2 240.2 circuits. This approach may be attractive since the cascade of bandlimited stages may have an accumulating effect on bandwidth reduction.

In an embodiment, interstage amplifiers 240.1-240.4 may be integrated onto the same integrated circuit substrate that channels 72.1-72.4 are integrated. In an embodiment, interstage amplifiers 240.1-240.4 may be implemented using amplifiers that are external to the integrated circuit substrate upon which channels 72.1-72.4 are integrated. In an embodiment, a high-dynamic range waveform digitizer 250 may be implemented into a lidar integrated system 290.

In an application, there may be remote sensor arrays that are separated in location. The number of sensors in each sensor array may be as few as one, or be more than one. In an application, sensor arrays may be positioned up to a few meters apart in distance. In said application, one or more sensor arrays may be positioned several meters apart while one or more sensor arrays may be positioned in closer proximity. In an application, sensor arrays may be portable wherein the position of a sensor relative to other sensor arrays may be easily modifiable. Applications with remote sensor arrays may pose implementation challenges when high sample rates on the order of 1 GHz are used. The use of conventional at-speed ADCs may be problematic in said applications due to the high data transfer rates that may be required and the high peak currents that may be required to support the high-speed ADCs. The waveform digitizer 72 may be well suited to said application due to high-sample rate capability and low peak current requirements. A sensor array and a local waveform digitizer may comprise a sensor node. The distribution of control signals and most important, routing of high speed data from each of the sensor nodes to the Digital Data Acquisition Block may pose implementation challenges.

Figures 22, 23:
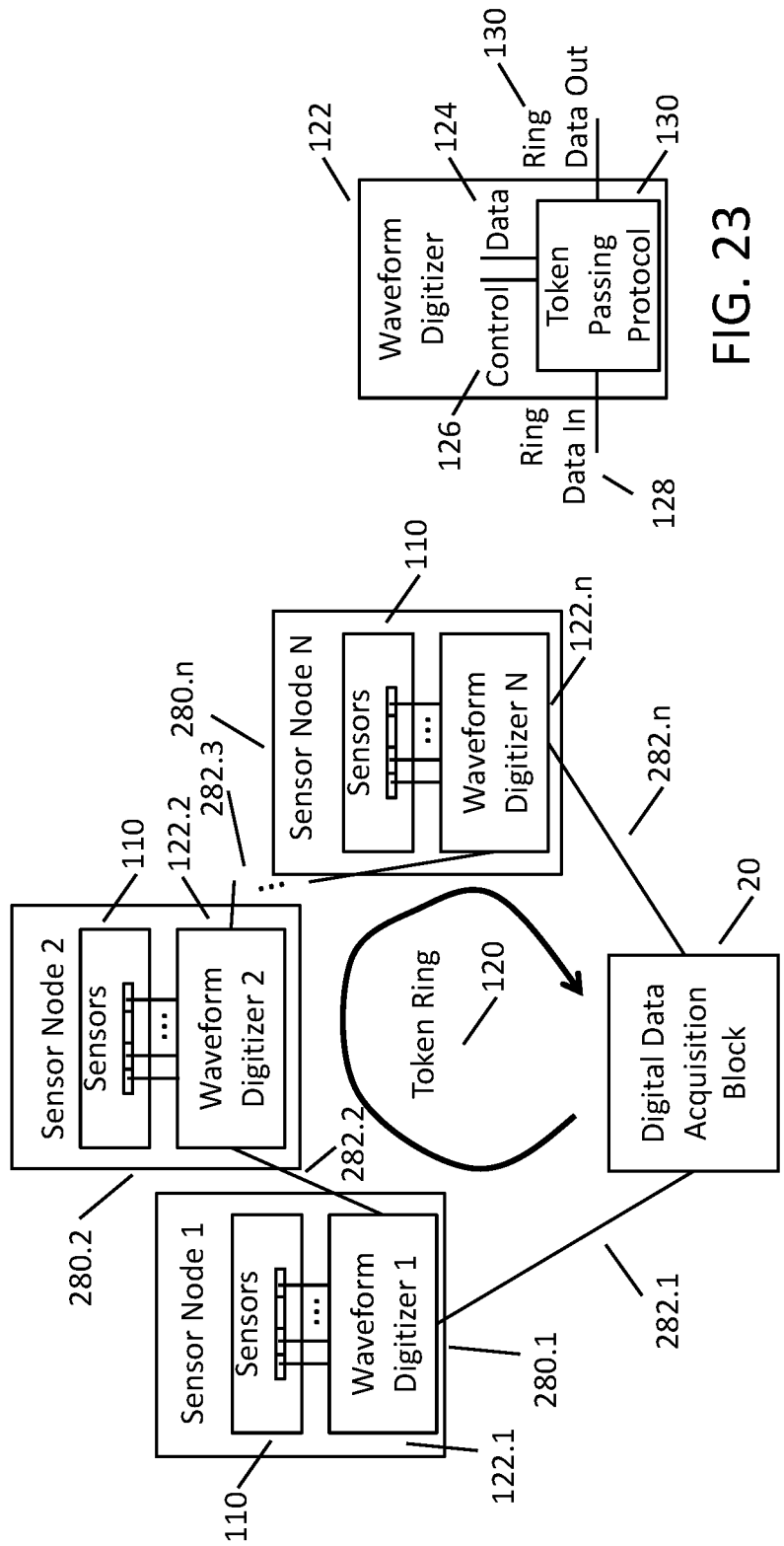
FIG. 22 illustrates a block diagram of a multiplicity of sensor nodes each containing a sensor array and waveform digitizer, wherein the sensor nodes communicate over a ring topology utilizing a token passing protocol.
FIG. 23 illustrates a block diagram of a waveform digitizer with an integrated block implementing a token passing protocol.

With reference to FIG. 22, an embodiment is presented wherein a multiplicity of Sensor Nodes 280.1, 280.2, 280.$n$ are configured in a ring topology and may use a token passing protocol 120 to mediate communication. With reference to FIG. 23, a waveform digitizer 122 with a functional block supporting a token passing protocol 130 is presented. The block may have input Ring Data In 128 which may receive data from the token passing ring 120, output Ring Data Out 130 which may transmit data into the token passing ring 120, a Control 126 output to distribute received control data from the Digital Data Acquisition Block 20, and a Data input 124 that receives data from the waveform digitizer 122 to be transmitted to the Digital Data Acquisition Block 20. In said embodiment with reference to FIG. 22, a Digital Data Acquisition Block 20 may send the token and control data over communication line 282.1 to Sensor Node 1 280.1, which may send the token, control data, and data acquired from sensors over communication line 282.2 to Sensor 2 280.2, which may send the token, control data, and data acquired from sensors through the ring topology, eventually to Sensor Node N, which sends the token, control data, and data acquired from sensors to the Digital Data Acquisition Block 20. In an embodiment, the communication lines 282 may utilize LVDS signalling. In an embodiment, before any of the Sensor Nodes have data to send, the Digital Data Acquisition Block 20 may initiate communication by sending out the token that may be passed from sensor node to sensor node throughout the ring 120. If a sensor node 280 identifies activity in one or more of the sensors and acquires and digitizes data to send, when the token is received by said sensor node 280, said sensor node 280 may hold the token, transmit its acquired data into the ring, and then release the token when transmitting data is complete. Beginning with the initiating sensor node, reception and transmission of data through each sensor node through the ring may occur until the data is received by the Digital Data Acquisition Block 20.

Figure 24:
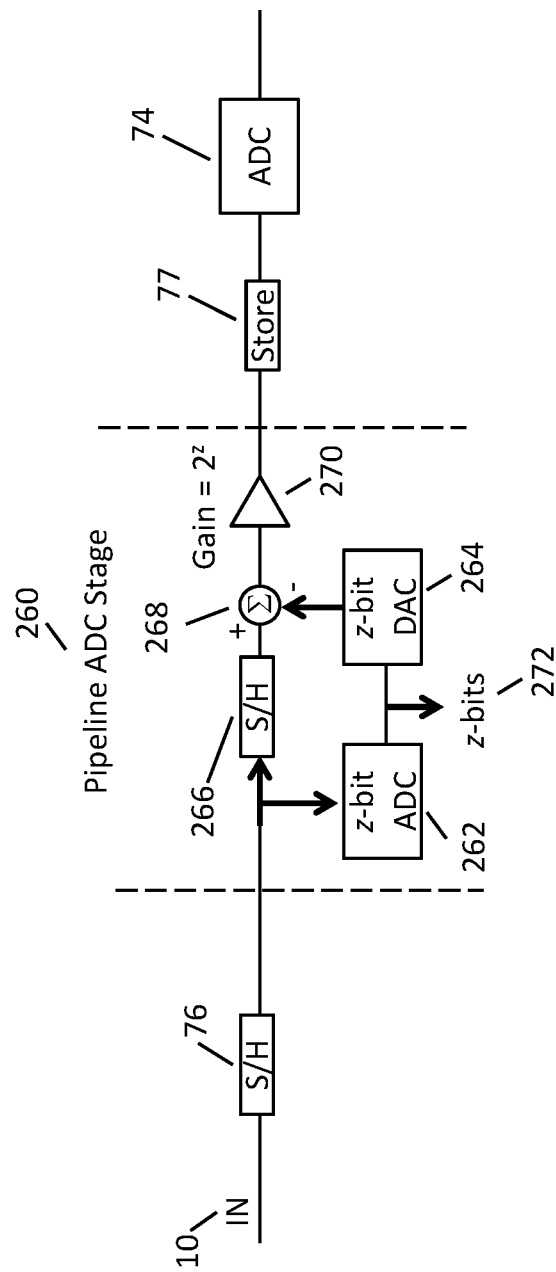
FIG. 24 illustrates insertion of a pipeline ADC stage between the S/H Array and the Storage Array to increase composite ADC dynamic range.

In an embodiment, the ADC 74 may be implemented using one of many different architectures including the Wilkinson ADC, flash-converter, multi-step flash converter, successive approximation (SAR), algorithmic converter, pipeline converter, or sigma-delta converter architecture. In an embodiment, another analog-to-digital converter architecture may be used. The ADC may be implemented using time-interleaving wherein one ADC block may connect with more than one storage cell in a storage window. With reference to FIG. 24, an embodiment of an isolated channel path is presented wherein a pipeline converter stage 260 is inserted between the S/H Array 76 and the Storage Array 77. A generic z-bit pipeline stage is presented with input node driven by S/H Array cell 76. The input may connect to S/H 266 and to a z-bit ADC 262. The z-bits 272 output from the ADC may drive a z-bit DAC 264 which generates an analog voltage. Summing block 268 may take the difference between the S/H 266 output and the z-bit DAC 264 output. The output of the summing block 268 may generate the so-called residue, and the residue may be amplified by amplifier 270 with gain=$2^z$. The z-bits output from the ADC 262 may be concatenated to the output bits of ADC 74 and create a composite ADC output data wherein the ADC 262 output bits may comprise the z-most significant bits of the composite ADC output data. For example if z equals 2 and the ADC 74 is a 10-bit converter, the composite ADC output may be 12-bits with the two MSBs taken from the Pipeline ADC Stage 260. In an embodiment, z may be 2. In another embodiment, z may be greater than 2. In another embodiment, z may be one.

Figures 25, 26:
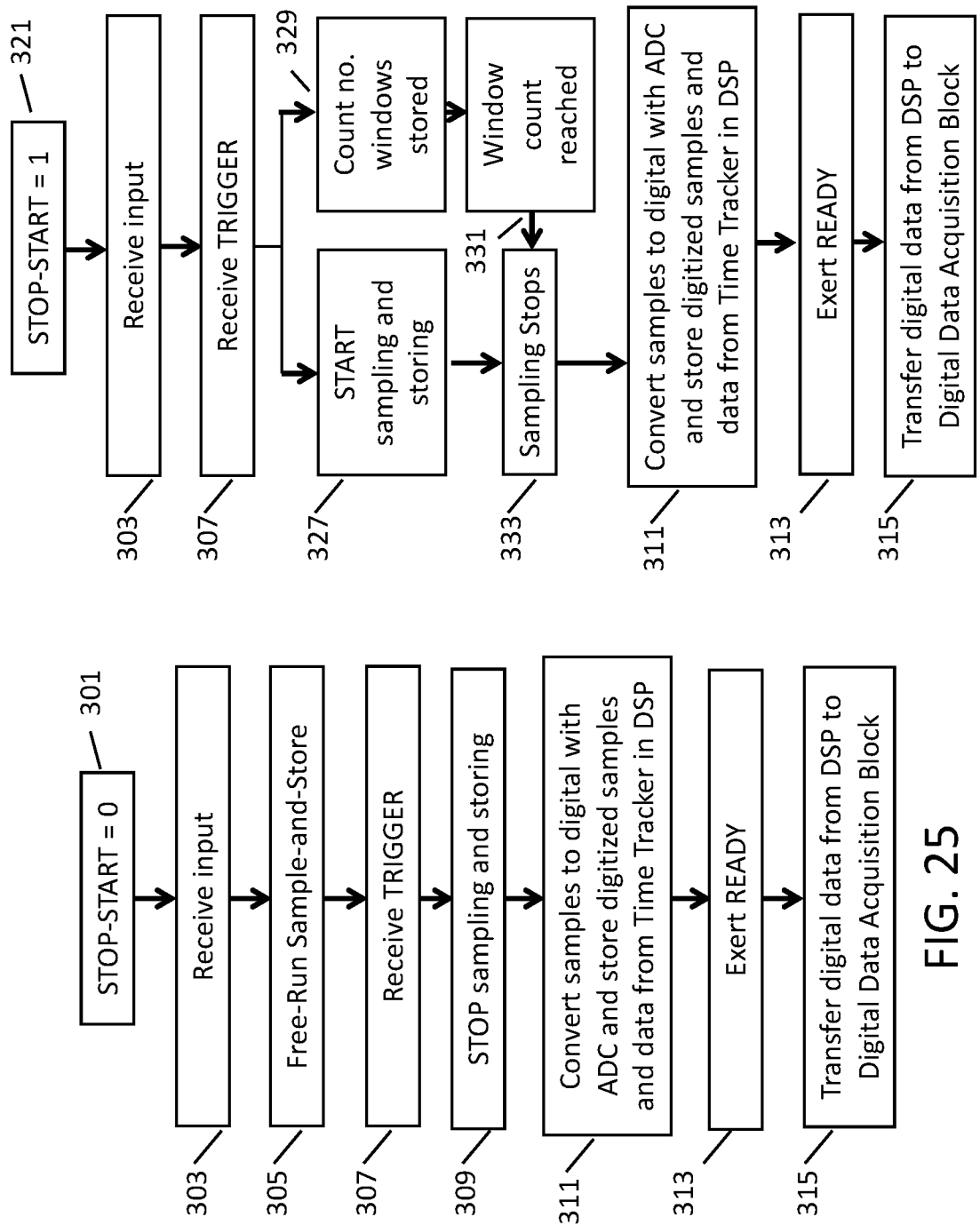
FIG. 25 illustrates a flow diagram of the operation of a waveform digitizer system that may support starting the acquisition of an observation period or stopping the acquisition of an observation period on exertion of the TRIGGER signal based upon STOP-START bit set to logic 0.
FIG. 26 illustrates a flow diagram of the system of FIG. 25 based upon STOP-START bit set to logic 1.

With reference to FIG. 25 and FIG. 26, a flow graph of the key steps in the implementation of a waveform digitizer using a STOP-START control bit to determine the role of TRIGGER is shown. The case with STOP-START=0 is presented in FIG. 25 and the case with STOP-START=1 is presented in FIG. 26. In an embodiment, the circuit architecture may be identical and the differences in functionality may be controlled by the STOP-START control bit.

With reference to FIG. 25, STOP-START=0 301. Begin by receiving an input from a sensor 303 and the sample-and-store process operates in Free-Run 305. Receive TRIGGER command 307 and stop sampling and storing 309. An observation period is stored in analog storage. Begin converting the samples in analog storage into the digital domain with the ADC and store the digitized samples and timing data provided by the Time Tracker into the DSP 311. When the entire storage array has been digitized, exert the Ready 54 signal. Then transfer the data to the Digital Data Acquisition Block 315.

With reference to FIG. 26, STOP-START=1 321. Begin by receiving an input from a sensor 303. Receive TRIGGER command 307 and start the sample-and-store process 327 and begin counting windows of stored samples 329. When the window count equals that of the Observation Period 331, stop sampling and storing. Begin converting the samples in analog storage into the digital domain with the ADC and store the digitized samples and timing data provided by the Time Tracker into the DSP 335. When the entire storage array has been digitized, exert the Ready signal 313. Then transfer the data to the Digital Data Acquisition Block 315.

Figure 27:
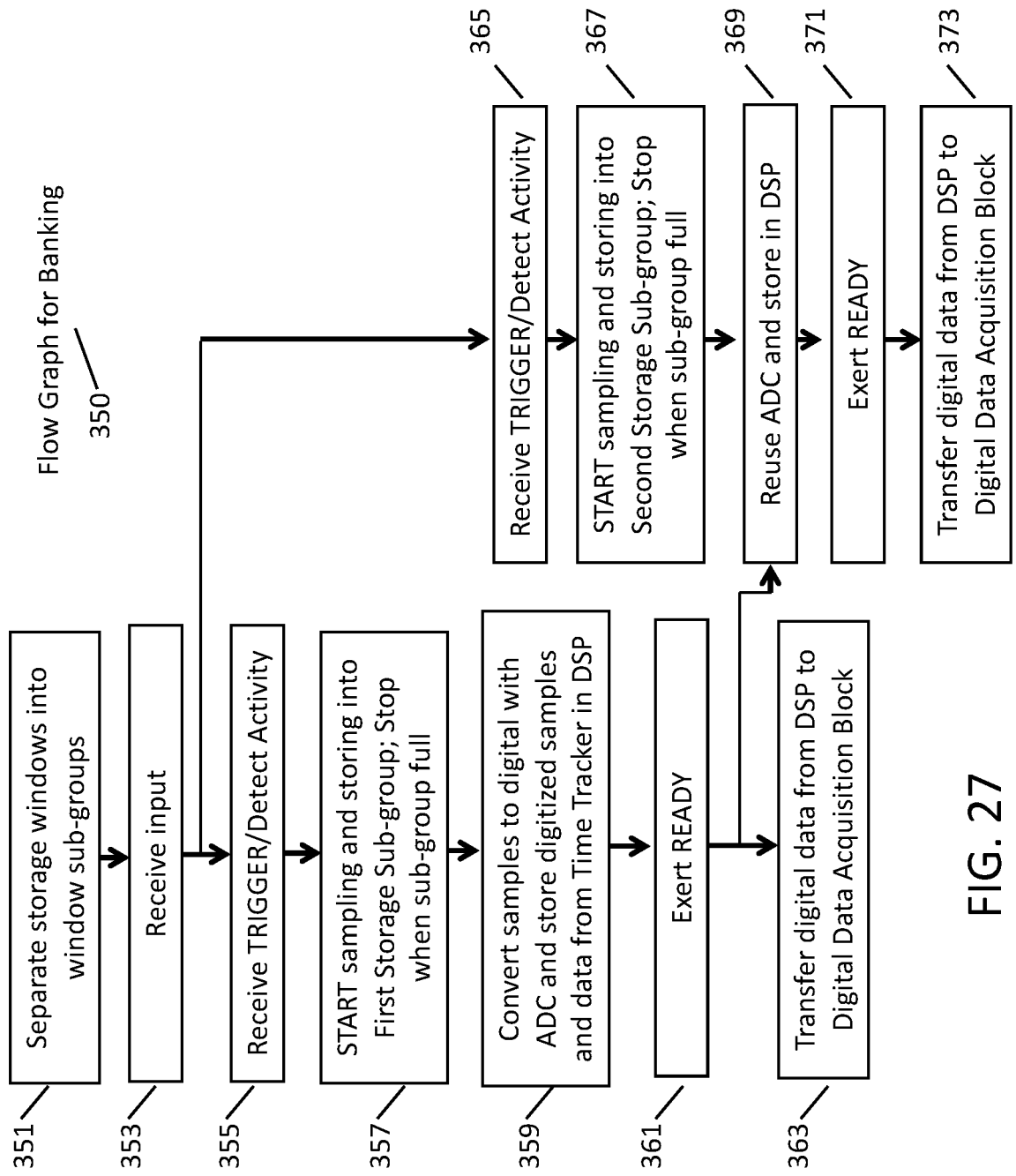
FIG. 27 illustrates a flow diagram of the operation of a system employing banking.

With reference to FIG. 27, a flow graph of Banking 350 is presented. Banking 350 is a technique to organize and use storage windows to enable sampling and storing new samples while a previously taken set of samples are being digitized by the ADC. Begin by separating the available storage windows into window sub-groups 351. Receive the input signal 353. Receive a TRIGGER signal or detect activity by the Activity Detector 355. Start sampling and storing into a first storage sub-group. When the storage in the first sub-group is full of fresh samples, stop sampling and storing 357. Convert samples from the first storage sub-group to the digital domain with the ADC and store digitized samples and data from the Time Tracker in the DSP. While the first storage sub-group is connected to the ADC, if a TRIGGER is received or if the Activity Detector detects activity in the input being samples by a second storage sub-group, start sampling and storing into the second storage sub-group. When the storage in the second sub-group is full of fresh samples, stop sampling and storing 367. Note that sampling and storing into the second sub-group may be in parallel with analog-to-digital conversion of the samples from the first sub-group, that is both 359 and 367 may be occurring at the same time. When digitization of the samples from the first sub-group is complete, READY may be exerted 361. In addition to transferring data from the DSP to the Digital Data Acquisition Block 363, the ADC may be reused to digitize samples in the second sub-group. The digitized samples and data from Time Tracker may be stored in the DSP 369. When each of the samples in the second sub-group have been digitized, the READY signal may be exerted 371 and the data may be transferred from the DSP to the Digital Data Acquisition Block 373. While the samples of the second sub-group are being digitized by the ADC, the first window sub-group may be utilized to sample and store a fresh set of samples. In an embodiment where the analog storage array is partitioned into more than two window sub-groups, the algorithm may be extended to utilize additional window sub-groups. An important objective of banking 350 is to avoid the situation in which each of the window sub-groups has been filled with fresh samples and waiting in line for the ADC to complete conversion of previously filled window sub-groups so that stored samples may be digitized. In an embodiment, the number of windows in a window sub-group may be one, which may result in the maximum number of window sub-groups. This may increase requirements on the accuracy and bandwidth of the Activity Detector and increase complexity of the Time Tracker.

Figure 28:
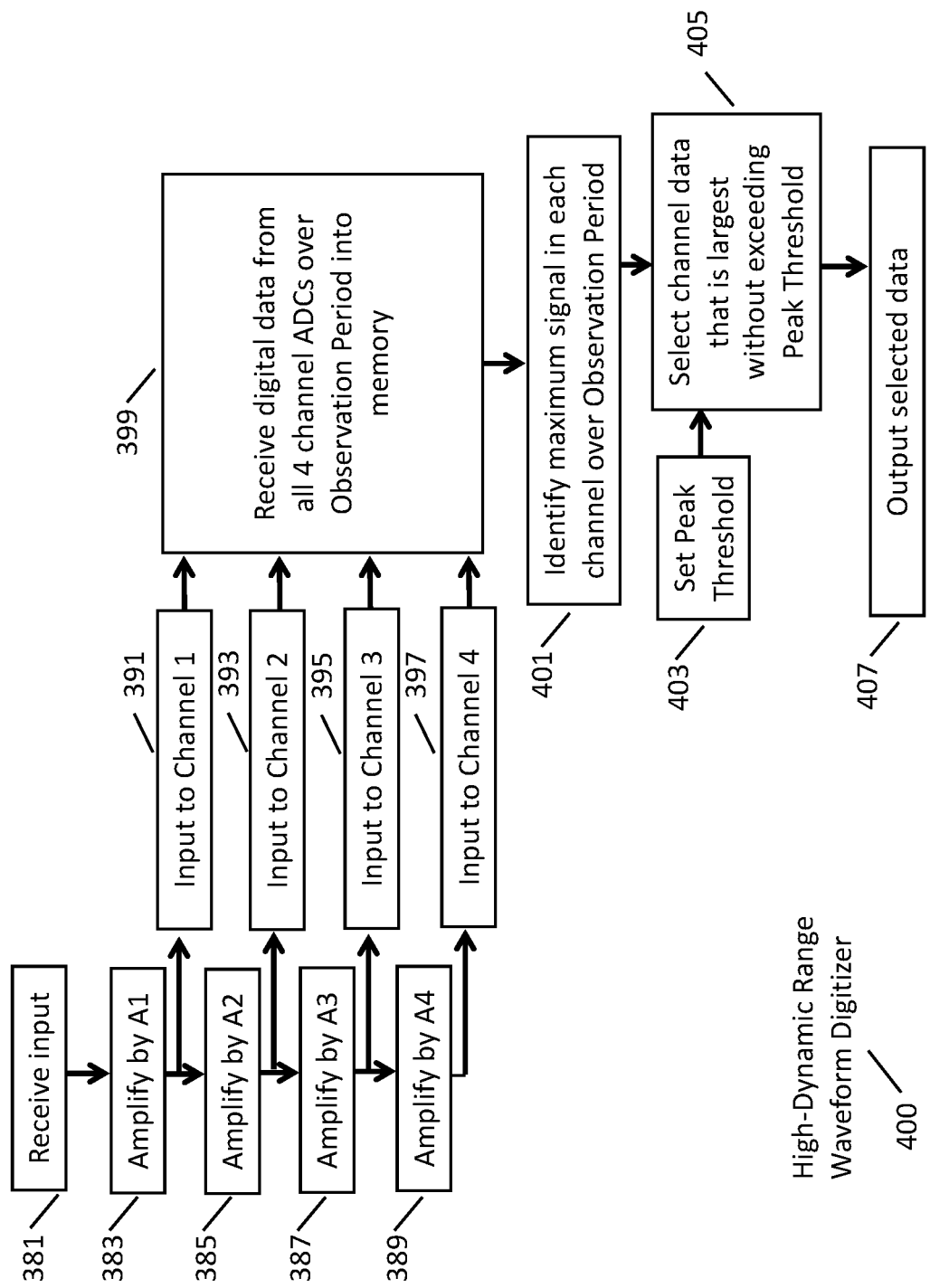
FIG. 28. illustrates a flow diagram the operation of a system utilizing a multiplicity of wideband amplifiers and a multiplicity of channels to implement a high-dynamic range waveform digitizer.

With reference to FIG. 28, a flow graph of a high-dynamic range waveform digitizer is presented. Begin by receiving input 381. Input may be input to a first amplifier that amplifies by A1 383. The output of the first amplifier may be input to Channel 1 391 and a second amplifier that amplifies by A2 385. The output of the second amplifier may be input to Channel 2 393 and a third amplifier that amplifies by A3 387. The output of the third amplifier may be input to Channel 3 395 and a fourth amplifier that amplifies by A4 389. The output of the fourth amplifier may be input to Channel 4 397. The digital outputs from ADCs from each of the four channels 391, 393, 395, 397 may be input into memory in the DSP 399. Next, identify the maximum signal in each channel of the Observation Period 401. Set the peak threshold 403 for the selection algorithm. Select the channel data that is largest without exceeding the Peak Threshold 405. Finally, output the selected channel data 407.

Figure 29:
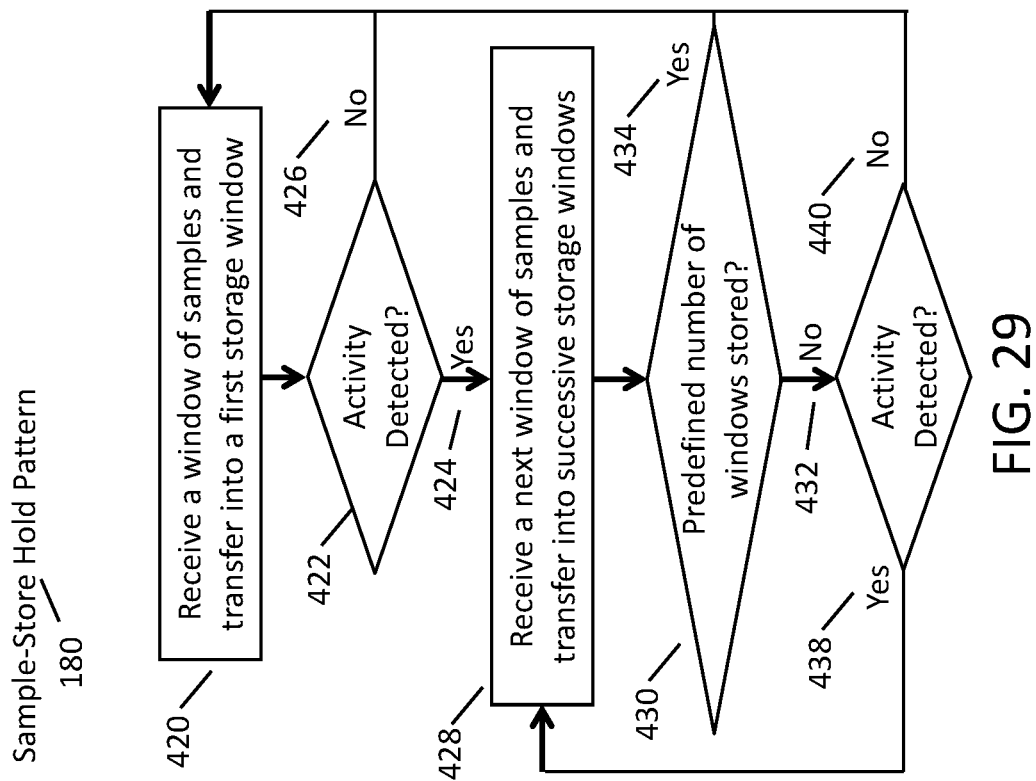
FIG. 29. illustrates a flow diagram of a channel implementing a sample-store hold pattern.

With reference to FIG. 29, a flow graph of a Sample-Store Hold Pattern 180 is presented. Begin by receiving a window of samples and transfer the acquired samples into a first storage window 420. Check Activity Detector for Activity Detected 422? If no 426 activity detected, return to 420. If yes 424 activity detected, receive a next window of samples and transfer acquired samples into a next storage window 428. Check if the predefined number of windows have been filled with fresh samples 430? If yes 434, return to 420. If no 432, check Activity Detector for Activity Detected 422? If yes activity detected, return to 428. If no 440, return to 420.

Figure 30:
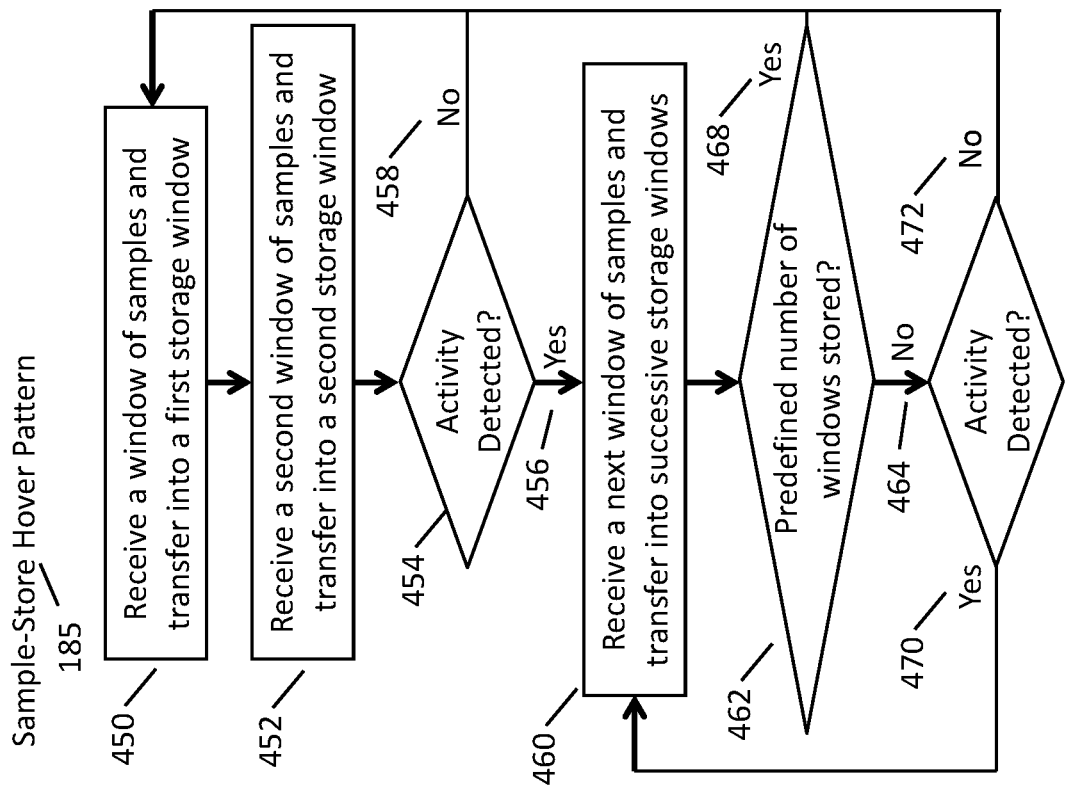
FIG. 30. illustrates a flow diagram of a channel implementing a sample-store hover pattern.

With reference to FIG. 30, a flow graph of a Sample-Store Hover Pattern 180 is presented. Begin by receiving a window of samples and transfer the acquired samples into a first storage window 450. Then, receive a second window of samples and transfer the acquired samples into a second storage window 452. Check Activity Detector for Activity Detected 452? If no 458, return to 420. If yes, receive a next window of samples and transfer acquired samples into a next storage window 428. Check if the predefined number of windows have been filled with fresh samples 430? If yes 434, return to 420. If no 432, check Activity Detector for Activity Detected 422? If yes, return to 428. If no 440, return to 420.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The present invention and some of its advantages have been described in detail for some embodiments. It should be understood that although the process is described with reference to a device, system, and method the process may be used in other contexts as well. It should also be understood that various changes, substitutions and alterations can be made herein without departing from the spirit and scope of the invention as defined by the appended claims. An embodiment of the invention may achieve multiple objectives, but not every embodiment falling within the scope of the attached claims will achieve every objective. Moreover, the scope of the present application is not intended to be limited to the particular embodiments of the process, machine, manufacture, composition of matter, means, methods and steps described in the specification. A person having ordinary skill in the art will readily appreciate from the disclosure of the present invention that processes, machines, manufacture, compositions of matter, means, methods, or steps, presently existing or later to be developed are equivalent to, and fall within the scope of, what is claimed. Accordingly, the appended claims are intended to include within their scope such processes, machines, manufacture, compositions of matter, means, methods, or steps.

What is claimed is:

1. A high-dynamic range data acquisition system, comprising:
    a sensor that emits sensor signals in response to detecting a particle collision or a reflected laser pulse;
    a first channel coupled to the sensor for processing the sensor signals;

a first amplifier coupled to the sensor for amplifying the sensor signals;

a second channel coupled to the first amplifier for processing the sensor signals after amplification by the first amplifier;

a digital signal processor processes output signals from the first channel and the second channel, a digital signal processor output for outputting digital data signals representing the sensor signals detected during an observation period;

a peak threshold filter that identifies a selected channel that has a highest signal amplitude that is below a predetermined Peak Threshold amplitude from the first channel and the second channel, wherein the digital data output signals processed by the digital signal processor only include the amplified signals from the selected channel; and a digital data acquisition block for storing the digital data output signals from the digital signal processor.

2. The high-dynamic range data acquisition of claim 1 further comprising:

a second amplifier coupled to the first amplifier for amplifying the sensor signals after amplification by the first amplifier; and a third channel coupled to the second amplifier for processing the sensor signals after amplification by the first amplifier and the second amplifier;

wherein the digital signal processor processes output signals from the first channel, the second channel, and the third channel and the peak threshold filter identifies the selected channel that has the highest signal amplitude that is below the predetermined Peak Threshold amplitude from the first channel, the second channel, and the third channel.

3. The high-dynamic range data acquisition of claim 2 further comprising:

a third amplifier coupled to the second amplifier for amplifying the sensor signals after amplification by the first amplifier and the second amplifier;

a fourth channel coupled to the third amplifier for processing the sensor signals after amplification by the first amplifier, the second amplifier and the third amplifier;

wherein the digital signal processor processes amplified output signals from the first channel, the second channel, the third channel, and the fourth channel and the peak threshold filter that identifies the selected channel that has the highest signal amplitude that is below the predetermined Peak Threshold amplitude from the first channel, the second channel, the third channel, and the forth channel.

4. The high-dynamic range data acquisition system of claim 1 wherein the observation period is less than 10,000 nsec and the digital data output signals are stored in the digital data acquisition block at a sample rate of more than 400 megahertz.

5. The high-dynamic range data acquisition system of claim 1 wherein the first channel and the second channel each include a sample and hold circuit, a storage array, and an analog to digital converter.

6. The high-dynamic range data acquisition system of claim 1 further comprising:

a time tracker having a trigger input, wherein the time tracker initiates the observation period when the trigger input is received.

7. The high-dynamic range data acquisition system of claim 1 further comprising:

an activity detector coupled to the sensor, wherein the activity detector initiates the observation period when a first input signal is received from the sensor.

8. The system of claim 1 wherein the sensor detects multiple particle collisions during the observation period.

9. The system of claim 1 wherein the sensor that emits sensor signals in response to detecting collision artifacts.

10. The system of claim 9 further comprising:

a processor that determines a relative timing between the particle collision and the detection of the collision artifacts from the digital data output signals.

11. The system of claim 1 further comprising:

a calibration source for transmitting a calibration signal to the first channel and the first amplifier wherein amplification of the calibration signal by the first amplifier is measured or a signal processing delay through the first amplifier is measured.

12. The system of claim 1 wherein the sensor detects multiple particle collisions during the observation period.

13. The system of claim 1 further comprising:

a processor that determines a relative timing between the particle collision and the detection of the collision artifacts from the digital data output signals.

14. A high-dynamic range data acquisition system, comprising:

a sensor that emits sensor signals in response to detecting a particle collision or a reflected laser pulse;

a sensor amplifier coupled to the sensor for amplifying the sensor signals;

a first channel coupled to the sensor amplifier for processing the sensor signals after amplification by the sensor amplifier;

a second amplifier coupled to the first amplifier for amplifying the sensor signals after amplification by the first amplifier;

a second channel coupled to the second amplifier for processing the sensor signals after amplification by the first amplifier and the second amplifier;

a digital signal processor processes output signals from the first channel and the second channel, a digital signal processor output for outputting digital data signals representing the sensor signals detected during an observation period;

a peak threshold filter that identifies a selected channel that has a highest signal amplitude that is below a predetermined Peak Threshold amplitude from the first channel and the second channel, wherein the digital data output signals processed by the digital signal processor only include the amplified signals from the selected channel; and a digital data acquisition block for storing the digital data output signals from the digital signal processor.

15. The high-dynamic range data acquisition of claim 14 further comprising:

a second amplifier coupled to the first amplifier for amplifying the sensor signals after amplification by the first amplifier; and a third channel coupled to the second amplifier for processing the sensor signals after amplification by the first amplifier and the second amplifier;

wherein the digital signal processor processes output signals from the first channel, the second channel, and the third channel and the peak threshold filter identifies the selected channel that has the highest signal amplitude that is below the predetermined Peak Threshold amplitude from the first channel, the second channel, and the third channel.

16. The high-dynamic range data acquisition of claim 15 further comprising:
- a third amplifier coupled to the second amplifier for amplifying the sensor signals after amplification by the first amplifier and the second amplifier;
- a fourth channel coupled to the third amplifier for processing the sensor signals after amplification by the first amplifier, the second amplifier and the third amplifier;
- wherein the digital signal processor processes amplified output signals from the first channel, the second channel, the third channel, and the fourth channel and the peak threshold filter that identifies the selected channel that has the highest signal amplitude that is below the predetermined Peak Threshold amplitude from the first channel, the second channel, the third channel, and the forth channel.

17. The high-dynamic range data acquisition system of claim 14 wherein the first channel and the second channel each include a sample and hold circuit, a storage array, and an analog to digital converter.

18. The high-dynamic range data acquisition system of claim 14 further comprising:
- a time tracker having a trigger input, wherein the time tracker initiates the observation period when a trigger input signal is received.

19. The high-dynamic range data acquisition system of claim 14 further comprising:
- an activity detector coupled to the sensor, wherein the activity detector initiates the observation period when a first input signal is received from the sensor.

20. The system of claim 14 further comprising:
- a calibration source for transmitting a calibration signal to the first channel and the first amplifier wherein amplification of the calibration signal by the first amplifier is measured or a signal processing delay through the first amplifier is measured.

* * * * *

UNITED STATES PATENT AND TRADEMARK OFFICE
CERTIFICATE OF CORRECTION

| | |
|---|---|
| PATENT NO. | : 11,782,164 B2 |
| APPLICATION NO. | : 17/515745 |
| DATED | : October 10, 2023 |
| INVENTOR(S) | : Mostafanezhad et al. |

Page 1 of 1

It is certified that error appears in the above-identified patent and that said Letters Patent is hereby corrected as shown below:

In the Specification

At Column 1, Line 56, the sentence:
"This material is based upon work supported by the U.S. Department of Energy, Office of Science, under Award Numbers DE-SC0017833 and DE-SC0019527."

Should read:
"This invention was made with government support under DE-SC0017833 and DE-SC0015231 awarded by US Department of Energy. The government has certain rights in the invention."

Signed and Sealed this
Twenty-eighth Day of October, 2025

John A. Squires
*Director of the United States Patent and Trademark Office*